United States Patent [19]
Fujiwara et al.

[11] Patent Number: 5,291,450
[45] Date of Patent: Mar. 1, 1994

[54] READ CIRCUIT OF DYNAMIC RANDOM ACCESS MEMORY

[75] Inventors: Atsuhi Fujiwara, Kadoma; Hiroyuki Yamauchi, Takatsuki, both of Japan

[73] Assignee: Matsushita Electric Industrial Co., Ltd., Osaka, Japan

[21] Appl. No.: 798,173

[22] Filed: Nov. 26, 1991

[30] Foreign Application Priority Data

Nov. 28, 1990 [JP] Japan .................. 2-332502

[51] Int. Cl.$^5$ .............................. G11C 7/00
[52] U.S. Cl. .................... 365/203; 365/226; 365/189.11; 365/205
[58] Field of Search .............. 365/203, 189.05, 226, 365/189.11, 205

[56] References Cited

U.S. PATENT DOCUMENTS

| | | | |
|---|---|---|---|
| 4,780,852 | 10/1988 | Kajigaya et al. | 365/203 |
| 4,858,190 | 8/1989 | Yamaguchi et al. | 365/189.05 |
| 4,875,192 | 10/1989 | Matsumoto | 365/233.5 |
| 4,893,277 | 1/1990 | Kajigaya et al. | 365/203 |

OTHER PUBLICATIONS

K. Yanagisawa et al., ESSCIR, pp. 184–187.
Y. Nakagome et al., 1990 Symposium on VLSI Circuits, pp. 17–18.

Primary Examiner—Eugene R. LaRoche
Assistant Examiner—Andrew Tran
Attorney, Agent, or Firm—Willian Brinks Olds Hofer Gilson & Lione

[57] ABSTRACT

In a dynamic random access memory including a plurality of memory read circuit arrays, a sense amplifier has a circuit wherein a first switch (or a pair of first switches) and a pair of second switches connected in series to the first switch are connected between the common data lines and the common source line of a second precharger. The first switch is controlled according to the potential of the bit lines precharged by a first precharger, while the second switches are controlled according to the address signal. Further, a third switch is provided to connect the common source line to an activation potential for the common source line in the memory array not selected. A second precharger precharges the common source line in a memory array not selected to a second precharge potential and the common data lines in a memory array not selected to a third precharge potential during the time when the common source line and the common data lines are not selected. The first, second and the third precharge potentials are set so as to prevent a through current through the third switch. Alternatively, the third switch may be omitted by providing appropriate precharge potentials.

34 Claims, 19 Drawing Sheets

Fig. 3

READ CIRCUIT OF DYNAMIC RANDOM ACCESS MEMORY

BACKGROUND OF THE INVENTION

1. Field of the Invention

The present invention relates to a read circuit of dynamic random access memory.

2. Prior Art

A bit of memory cell in a dynamic random access memory (DRAM) consists for example of a capacitor for storing charges (information) and a switch for selecting the memory cell (address), and information of logic "1" and "0" is stored as charges are or are not stored in the capacitor. A large number of memory cells is arranged as a matrix at crossings of bit lines and word lines. A memory cell is selected by designating its address which is determined by a word line and a data line, and the information is read by turning on the switch to connect the capacitor to a bit line and by sensing a change in the potential of the bit line according to the charges stored in the capacitor.

In a DRAM of large capacity such as 64 MB, each memory cell has to be designed to have a small size, and a very large number of memory cells is connected to each bit line. Therefore, a ratio of the capacitance $C_a$ of the capacitor to the stray capacitance $C_b$ of the bit line becomes very small, and a change in the potential of the hit line becomes small and harder to sense.

In order to solve this problem, a bit line is multiply divided or a memory array is divided into a plurality of memory arrays in the direction of a bit line so as to reduce the number of memory cells connected to the bit line in each memory array, so that a ratio $C_a/C_b$ is reduced to a desired value. Further, in order to prevent the increase in area due to peripheral circuits such as decoders, a common selection signal line for selecting a bit line is connected so as to provide a selection signal of a bit line to the memory arrays.

In addition, in order to reduce the dissipation of electric power, sense amplifier circuits of DRAM are controlled so that only a sense amplifier circuit in correspondence to a memory array including a memory cell to be selected is activated.

FIG. 1 displays a circuit diagram of a portion of a prior art sense amplifier of DRAM which has a flip flop type sense amplifier of cross coupling type. In this amplifier, four MOSFETs (Q8, Q9, Q10 and Q11) for amplification are cross coupled to bit lines D and $\overline{D}$.

Recently, in a non-address-multiplex type dynamic random access memory (DRAM) (refer to K. Yanagisawa et al., ESSCIRC pp. 184–187) and in a low voltage 64 MB DRAM (Y. Nakagome et al., 1990 SYMPOSIUM ON VLSI CIRCUITS pp. 17–18), a new type of sense amplifier circuit is added besides the above-mentioned flip-flop type sense amplifier circuit, as shown also in FIG. 1. The new sense amplifier includes three transistors Q1, Q2 and Q3 in order to isolate the bit lines and the common data lines. That is, the potentials of the bit lines D and $\overline{D}$ are provided to the gates of the transistors Q1, Q2 while the column decode line YS is connected to the gate of the transistor Q3. The source electrodes of the transistors Q1 and Q2 are connected to the common data lines CD and $\overline{CD}$ of a precharger, while the drain electrodes of the transistors Q1 and Q2 are connected to the source electrode of the transistor Q3. The drain of the transistor Q3 is connected to the ground. Thus, the ground and the common data lines CD, $\overline{CD}$ are connected via the on resistance of the MOSFET (Q3).

The background of the introduction of this new technique is as follows: The stray capacitance of the common data line increases while the current driving force of sense amplifying transistors Q8–Q11 becomes smaller with an increase in the degree of integration of DRAM. Therefore, when bit lines and common data lines are connected via a switch, the data of the bit line is destroyed before the potential at the bit line is amplified sufficiently. Thus, in order to operate the reading function with the new sense amplifier circuit, it is necessary to isolate the bit lines from the common data lines electrically.

However, as mentioned above, when a selection signal of a data line in a plurality of memory arrays is generated by a common address decoder, the common data lines are connected to the ground even in the memory array parts not selected. At this time, because the common data lines are kept at the half precharge level ($V_{cc}/2$) or higher, the potential levels at the common data lines vary by a large amount. Thus, as shown with an arrow in FIG. 1, a through current flows to the ground via precharger circuits connected to the common data lines and to the transistors Q1–Q3 in the memory array parts not selected. Therefore, it is a problem to reduce the dissipation current in order to decrease the dissipation in a highly integrated DRAM.

SUMMARY OF THE INVENTION

It is an object of the present invention to provide a read circuit of DRAM wherein the reading action is stabilized while the memory capacity is increased and the dissipation current is reduced.

A read circuit according to the present invention is used for a dynamic random access memory wherein a plurality of memory cells each consisting of a transistor for address selection and a capacitor for storing information are arranged as a matrix at crossings of bit lines and word lines, and the memory cells are divided into a plurality of memory arrays. Further, an address decoder generates a signal for selecting a common data line for the memory arrays, while a word line selection circuit generates a signal to select a word line in correspondence to one of the arrays which includes one of the memory cells to be selected. The read circuit comprises: a first precharger for precharging the bit lines at a first precharge potential; a sense amplifier for amplifying the potential of the bit lines; means for supplying a first activation potential necessary to activate the amplification of the sense amplifier; a first switch controlled by a selection signal generated by the address decoder, the first switch being connected to a common source line, the common source line supplying a second activation potential necessary to activate the first switch; a pair of second switches connected in series to the first switch, the pair of second switches being connected to common data lines, the on resistances of the pair of the second switches being controlled according to the potential of the bit lines, the common data lines being connected so as to be always isolated electrically from the bit lines; a second precharger for precharging the common source line of one of the memory arrays not selected to a second precharge potential, and for precharging the common data lines in one of the memory arrays not selected to a third precharge potential during the time when the common source line and the common data lines are not selected; and a third switch for connecting the common source line in the selected memory array to the second activation potential. The first, second, and the third precharge potentials are set so as to prevent a through current through the third switch.

A read circuit may also comprise a pair of first switches and a pair of second switches instead of the first switch and the pair of the second switches of the abovementioned read circuit. That is, the first switch in the above-mentioned circuit is omitted while the pair of the first switches are added. Each of the first switches is connected in series to one of the second switches, and they are connected to common data lines. The on resistances of the pair of the second switches are controlled according to the potential of the bit lines.

Further, the third switch can be omitted so that the common source line is connected to the ground potential. In this case, a second precharger precharges the common data lines in one of the arrays not selected to a second precharge potential during the time when the common source line and the common data lines are not selected, and to a third precharge potential during the time when the common source line and the common data lines are selected.

BRIEF DESCRIPTION OF THE DRAWINGS

These and other objects and features of the present invention will become clear from the following description taken in conjunction with the preferred embodiments thereof with reference to the accompanying drawings, and in which:

FIG. 3 is a diagram of a part of the read circuit of DRAM shown in FIG. 2;

DETAILED DESCRIPTION OF THE PREFERRED EMBODIMENTS

Figure 1:
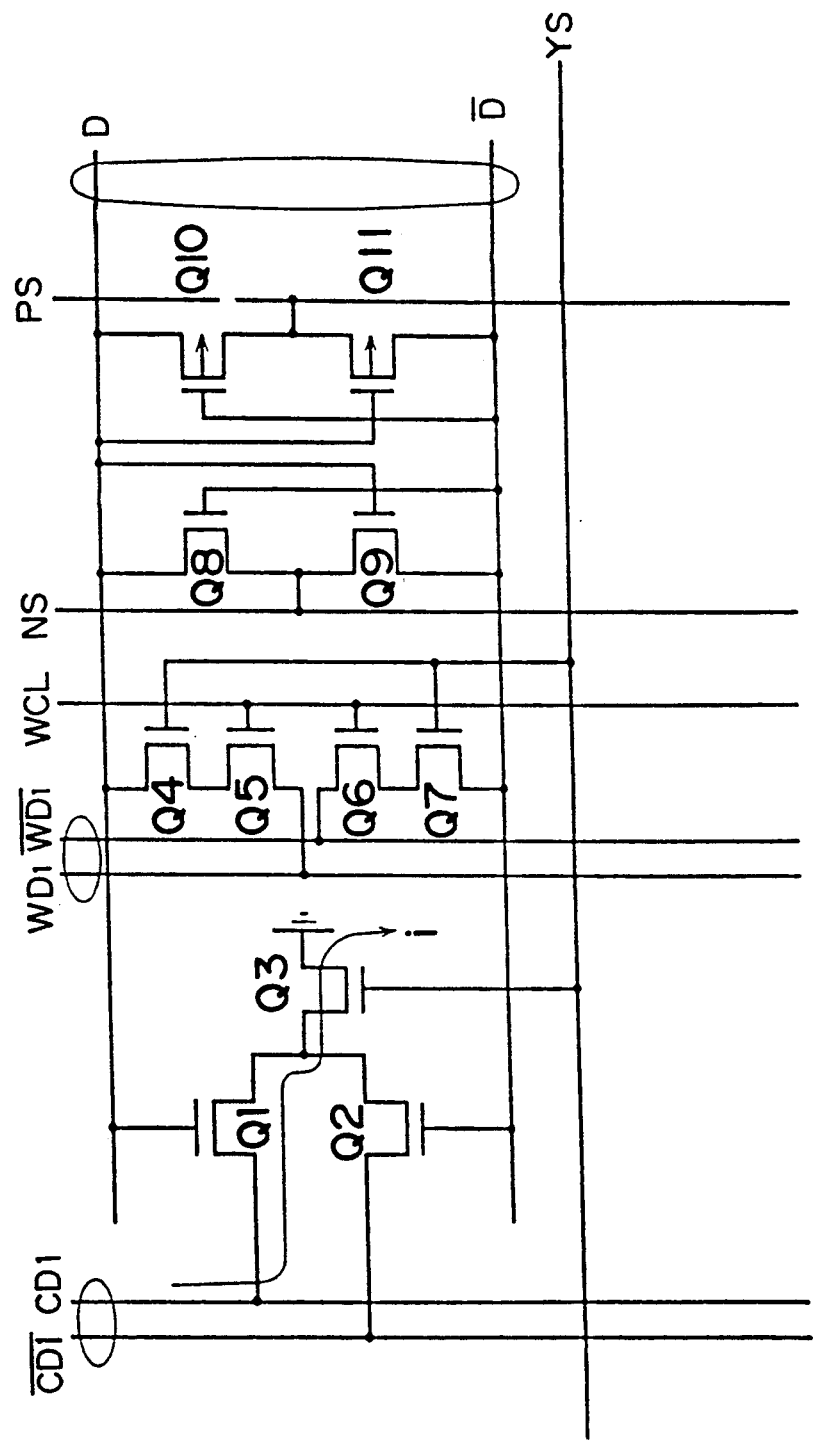
FIG. 1 is a diagram of a part of a sense amplifier of a prior art read circuit of a DRAM.

Referring now to the drawings, wherein like reference characters designate like or corresponding parts throughout the several views, embodiments of the present invention will be explained in detail.

Example 1

Figure 2:
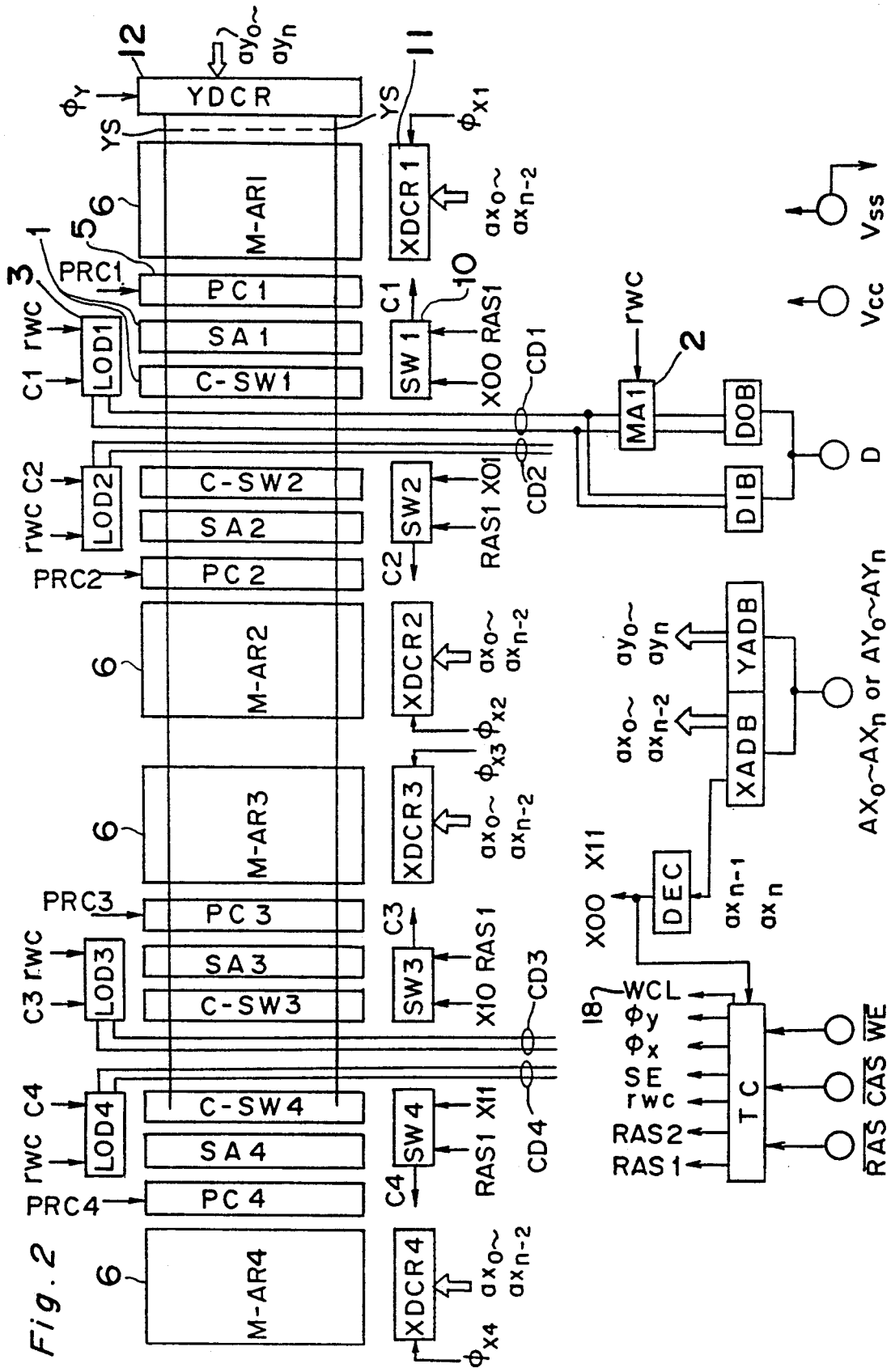
FIG. 2 is a diagram of a read circuit of DRAM wherein four memory arrays are arranged.

FIG. 2 shows a diagram of a read circuit of a dynamic random access memory wherein four memory arrays (M-AR$_1$, M-AR$_2$, M-AR$_3$ and M-AR$_4$) 6 are arranged so as to decrease the number of memory cells connected to bit lines in a memory array. A column address decoder (YDCR) 12 generates a selection signal YS$_n$ of a common bit line for the four memory arrays 6, while four selection circuits (XDCR) 11 each in correspondence to one of the memory arrays 6 generate a selection signal of word line only for the corresponding memory array 6. A write timing signal (WCL) 18 is generated by an external write enable signal $\overline{WE}$. A main amplifier 2 supply signals to common data lines CD$_n$ when a signal rwc is received in a read cycle.

Figure 3:
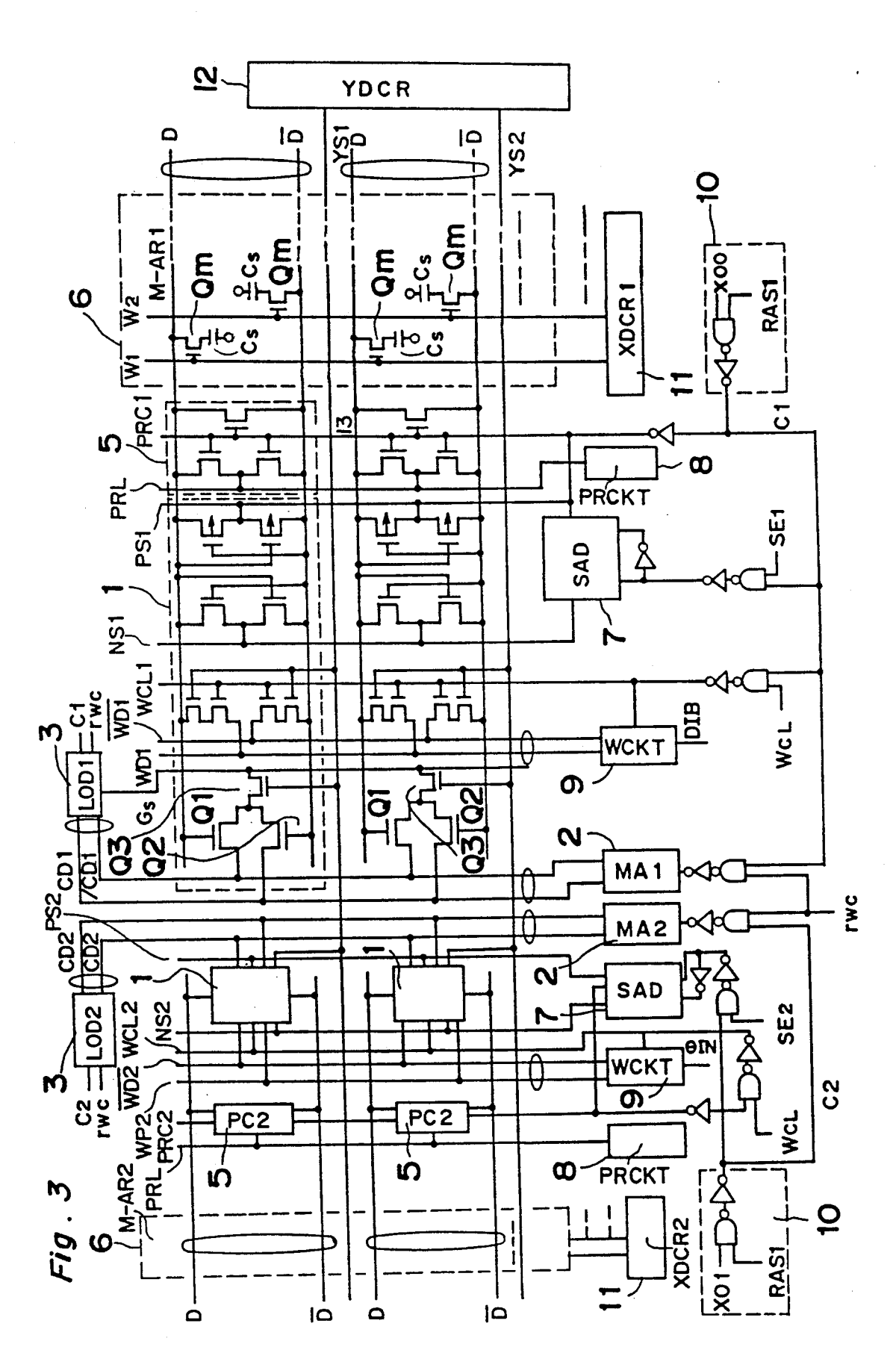
Figure 4:
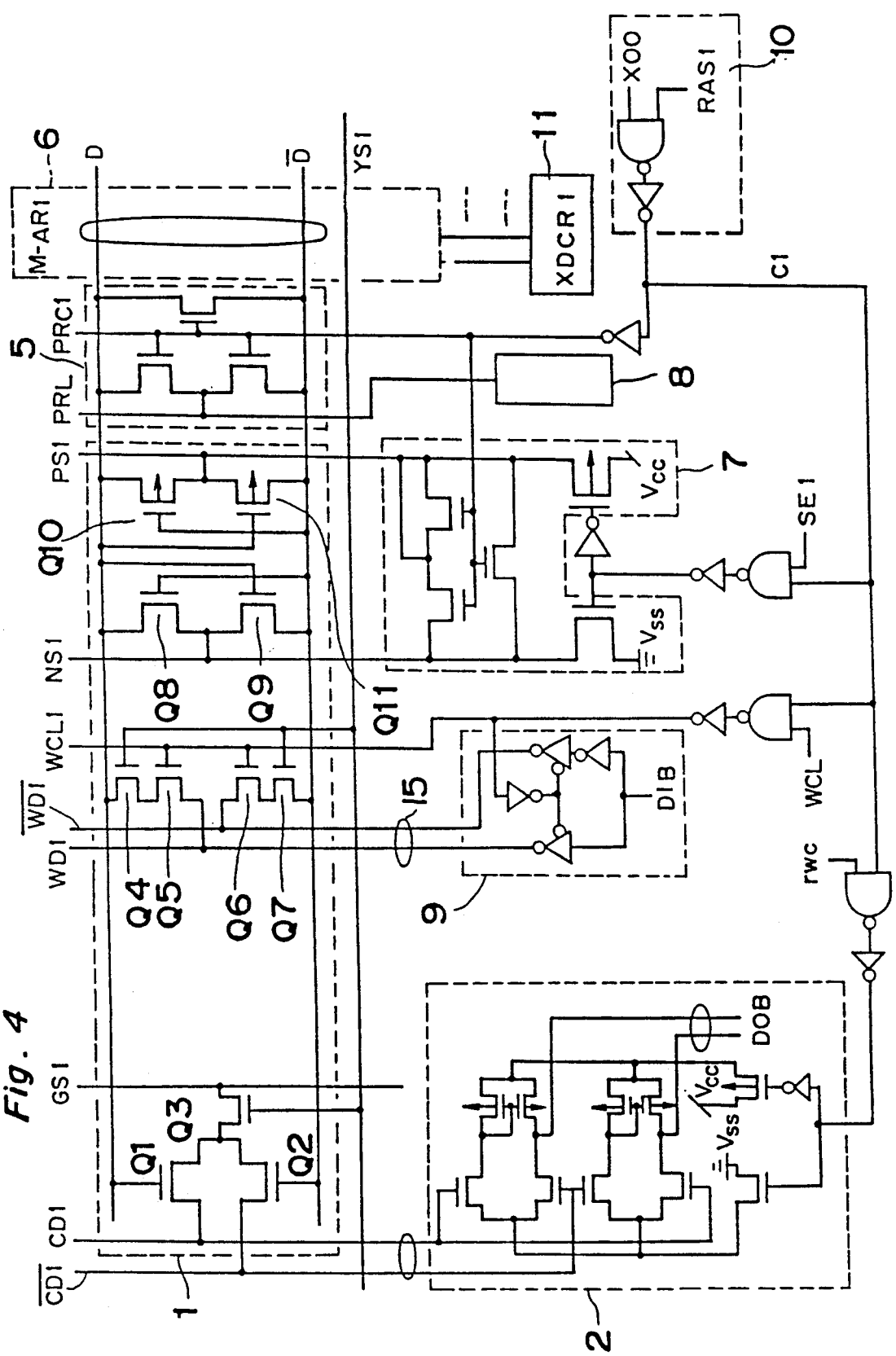
FIG. 4 is a diagram of a part of the read circuit of DRAM displayed in FIGS. 2 and 3.

FIG. 3 shows a diagram of a read circuit of DRAM wherein two memory arrays shown in FIG. 2 are arranged, and FIG. 4 shows a part of the read circuit shown in FIG. 3 in detail. Each memory array M-AR$_1$, M-AR$_2$ consists of memory cells each consisting of a capacitor Cs and a MOSFET as a switch Qm. A memory cell in each memory array is arranged at a crossing of a bit line D, $\overline{D}$ and a word line W1, W2 arranged as a matrix, or a memory cell is accessed by selecting a bit line and a word line. A bit line selection signal YS$_n$ is supplied by a column address decoder 12 to sense amplifiers 1, while a word line is connected to a selection circuit 11. A sense amplifier 1 amplifies the word line selection signal. A decode circuit 10 generates a memory array selection signal (block decode signal). C$_1$ and C$_2$ are determined by an AND gate which receives the decode lines X0$_0$, X0$_1$ of row address and a row address strobe signal RAS1 of RAS. An equalizing and precharging circuit (PC$_n$) 5 is used for precharging and equalizing to provide the half precharge potential (V$_{CC}$/2). A precharger 3 precharges the common data lines DC$_n$/ $\overline{CD}_n$ and the common source line GS$_n$. An equalizing and precharging circuit (PC$_n$) 5 precharges the bit lines D, $\overline{D}$ at a precharge potential by the same control signal PRC$_n$ provided by the decode circuit 10. A sense amplifier driver circuit (SAD) 7 is controlled by an active signal determined by a NAND gate to receive the active signal SE and the memory array selection signal C$_1$, C$_2$ in order to perform amplification only for a sense amplifier 1 in correspondence to the selected memory array 6. This circuit 7 includes a circuit to precharge common source lines NS$_n$, PS$_n$ of the sense amplifier 1 at a precharge level, say the precharge level V$_{CC}$/2, and provides a potential, say V$_{CC}$ or V$_{SS}$, necessary for the amplification of the sense amplifier 1. The sense amplifier circuit 7 is controlled by the same control signal PRC$_n$ provided by the decode circuit 10 as the equalizing and precharging circuit 5. A signal (rwc) 16 determines the timing to activate the main amplifier (MA$_n$) 2 which receives a signal from the common data lines CD$_n$, CD$_n$ in a read cycle in the operation of DRAM. A write circuit (WCKT) 9 is connected to the write data lines WD$_n$, $\overline{WD}_n$ provided separately beside the common data lines.

The sense amplifier 1 includes a flip flop type sense amplifier of cross couple type which consists of four MOSFETs (Q8, Q9, Q10 and Q11) for sense amplification. Further, it includes a sense amplification circuit consisting of three transistors Q1, Q2 and Q3 to isolate the bit lines and the common data lines. That is; the potential of the bit lines D, $\overline{D}$ are provided to the gate electrode of the transistors Q1, Q2 while the column decode line $YS_n$ is connected to the gate of the transistor Q3. The source electrodes of the transistors Q1 and Q2 are connected to the outputs $CD_n$ and $\overline{CD_n}$ of the precharger 3, while the drain electrodes of the transistors Q1 and Q3 are connected to the source electrode of the transistor Q3. The drain of the transistor Q3 is connected to the ground line $GS_n$ of the precharger 3. Thus, the ground line $GS_n$ and the common data line $CD_n$, $\overline{CD_n}$ are connected via the on resistance of the MOSFET (Q3).

Figure 5:
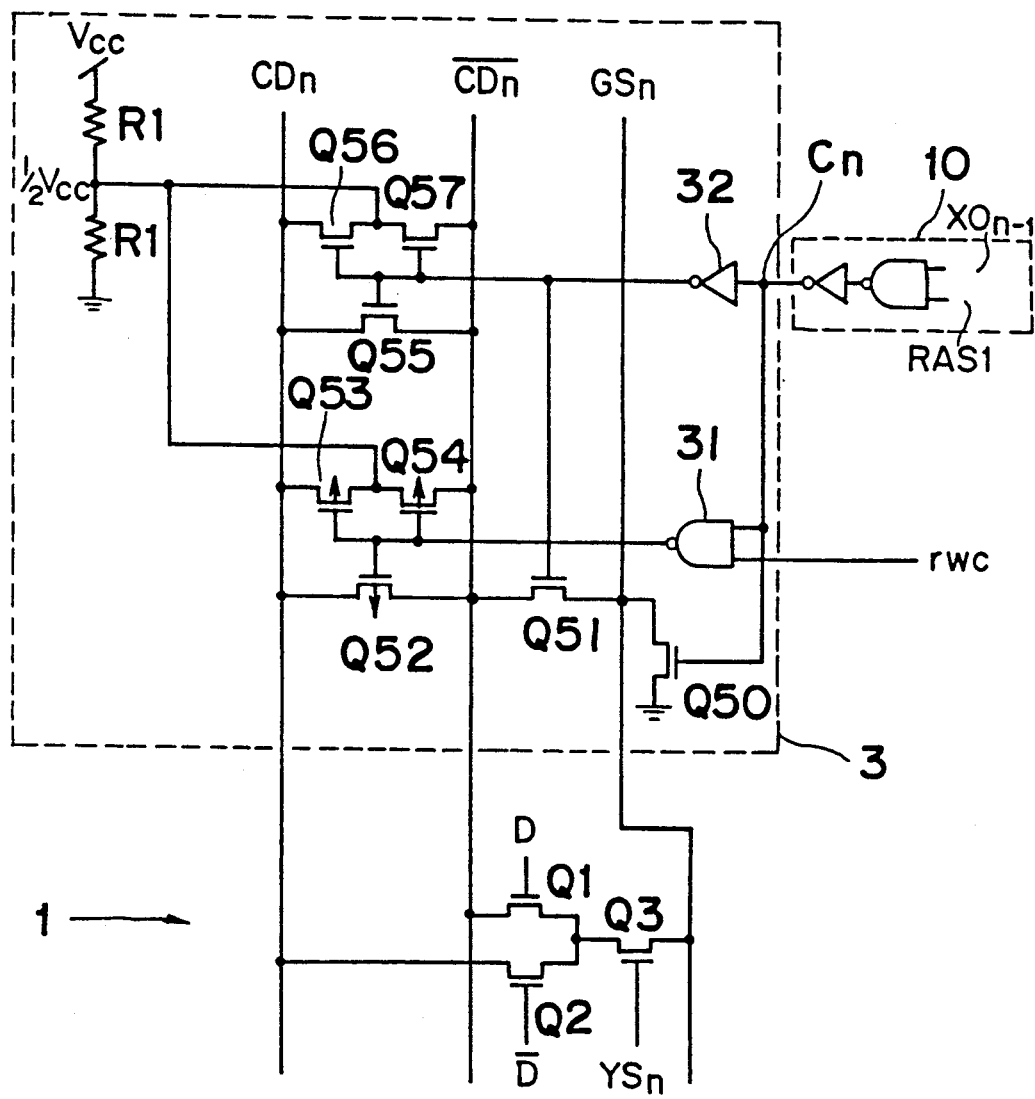
FIG. 5 is a diagram of a precharger of the read circuit.

FIG. 5 shows a diagram of a precharger 3 of the read circuit. The decode circuit 10 generates a block decode signal $C_n$ according to a row address strobe signal RAS1 and a row address $XO_{n-1}$, and provides the block decode signal $C_n$ via a NAND gate 31 to the gates of the transistors Q52–Q54 and via an inverter 32 to the gates of the transistors Q55–Q57. A read signal rwc is also provided to an input of the NAND gate 31. The two transistors Q53 and Q54 as well as Q56 and Q57 are both connected in series and are arranged between common data lines $CD_n$ and $\overline{CD_n}$, and a precharge potential $V_{cc}/2$ generated by two resistors R1 is provided to the connections between the two transistors. Further, the transistors Q52 and Q55 are also arranged between the common data lines. Thus, the transistors Q52–Q54 precharge the common data lines $CD_n$ and $\overline{CD_n}$ at the precharge level in a time when the common source lines and the common data lines are selected, while the transistors Q55–Q57 precharge the common data lines $CD_n$ and $\overline{CD_n}$ at the precharge level in a time when the common source lines and the common data lines are not selected. It should be noted that a transistor Q51 is connected between the common data line $CD_n$ and a common source line $GS_n$, while the inverter 32 provides a signal to the gate of the transistor Q51. Thus, the transistor Q51 can precharge the common source line $GS_n$ at the same precharge potential as that of the data lines $CD_n$ and $\overline{CD_n}$. Further, it should be noted that a transistor Q50 is connected between the common source line $GS_n$ and the ground, and the block decode signal is provided by the circuit 10 to the gate of the transistor Q50. That is, only the transistor Q50 in the selected memory array is turned on to decrease the potential at the common source line $GS_n$ to the ground level.

A characteristic of the read circuit in Example 1 is that the common source line $GS_n$ is connected to switches Q3 controlled by column decode lines $YS_n$. As shown in FIGS. 2–5, a switch Q3 is connected in series to MOSFETs (Q1, Q2) which are connected at the gate electrode to the bit line D, $\overline{D}$ and at the drain electrode to the common data line $CD_n$ and $\overline{CD_n}$. Thus, the switches Q3 operate to connect, or alternatively, not connect the common data lines $CD_n$ and $\overline{CD_n}$ to the common source line $GS_n$ according to the on resistance of the MOSFETs (Q1, Q2), which is controlled by the potential of the bit line D, $\overline{D}$. That is, the common source line $GS_n$ is connected to the common data lines $CD_n$ and $\overline{CD_n}$ via the switch Q3 to be turned on by the column decode line $YS_n$ and via the switches Q2 and Q3 connected to the bit lines D, $\overline{D}$ at the gate.

In the selected memory array, the common source line $GS_n$ is connected to $V_{ss}$, and the potential of the common source line $GS_n$ decreases to $V_{ss}$. Therefore, the potentials of the common data lines $CD_n$ and $\overline{CD_n}$ also decrease to $V_{ss}$ under the control of the switches Q1 and Q2. On the other hand, in the memory arrays not selected, the common source line $GS_n$ and the common data lines $CD_n$, $\overline{CD_n}$ are precharged at the same potential, say the half precharge level. Therefore, even if the common source line $GS_n$ is connected to the common data lines $CD_n$ and $\overline{CD_n}$ via the switches Q1, Q2 and Q3, a through current does not flow from the common data lines $CD_n$ and $\overline{CD_n}$ to the ground because both are kept at the same potential, even if the switches are turned on.

Figure 6:
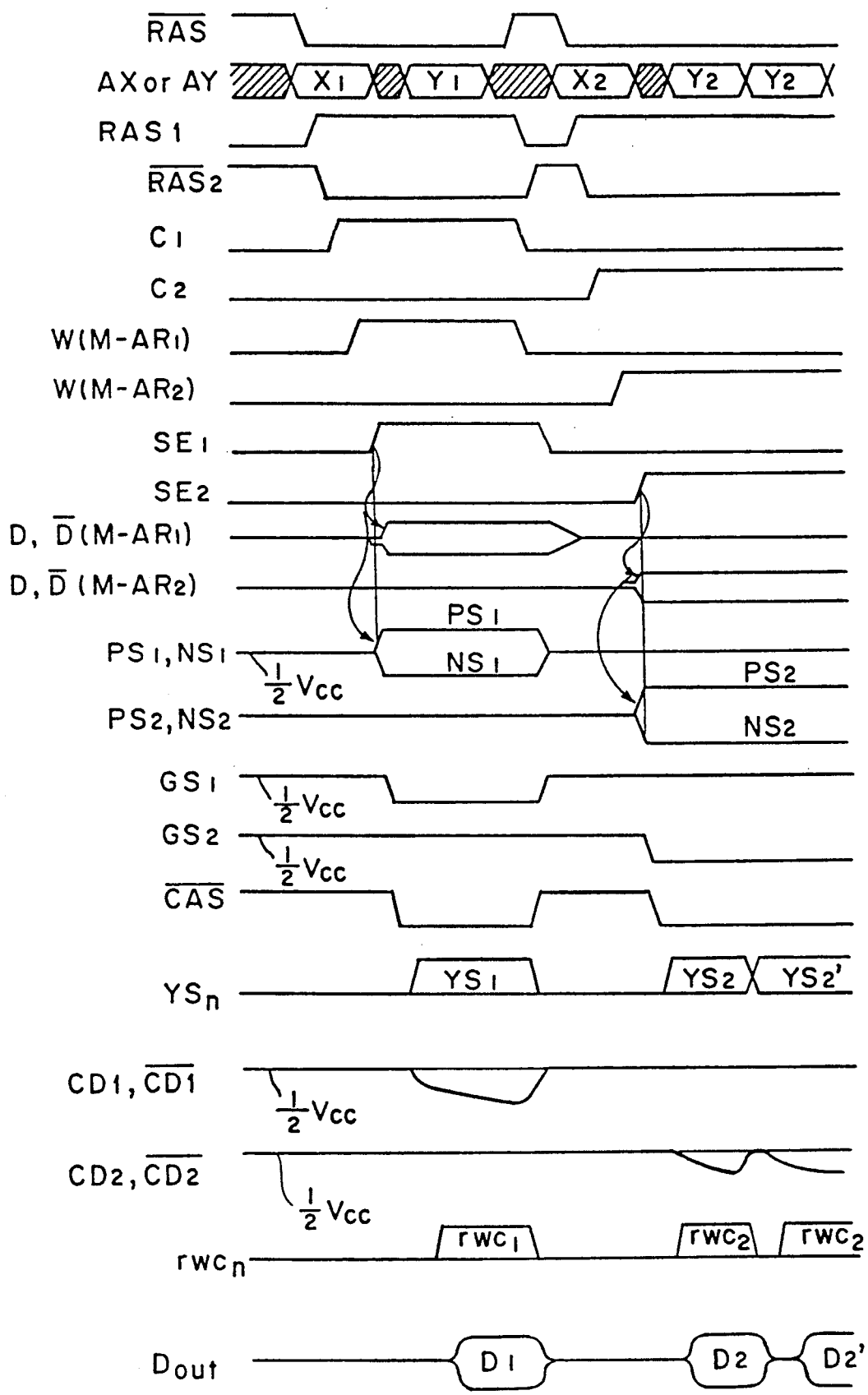
FIG. 6 is a timing chart of the read circuit.

Read action is performed as shown in a timing chart shown in FIG. 6. In this chart, the memory arrays $M-AR_1$ and $M-AR_2$ are selected successively. When a block is selected (RAS=0), the block is changed from the standby state to the active state. First, a memory array selection signal $C_n$ is generated and an activation signal $SE_n$ is provided to activate the sense amplifier drive circuit 7, and the bit lines D and $\overline{D}$ and common source signals $PS_n$ and $NS_n$ of the sense amplifier 1 are activated. Thus, a common source line $GS_n$ and the common data lines $CD_n$ and $\overline{CD_n}$ provided for the memory array $M-AR_n$ are connected via the switches Q1 and Q2 to be connected at the gates to the bit lines D, $\overline{D}$ and via the switches Q3 to be turned on by the column decode line $YS_n$. In the selected memory array ($M-AR_n$) 6, the potential of the common source line $GS_1$ is decreased by a switch Q50 shown in FIG. 5 from the half precharge level ($V_{cc}/2$) to the ground level $V_{ss}$. Therefore, the potentials at the common data lines CD and $\overline{CD}$ also decrease according to the on resistance of the switches Q1 and Q2 controlled by the potential of the bit lines D, $\overline{D}$, as shown in FIG. 6.

On the other hand, in memory arrays 6 not selected, for example $M-AR_2$, as shown in FIG. 4, the common source line $GS_2$ is kept the same as the precharge level of the common charge line, for example the half precharge level ($V_{cc}/2$). Therefore, even if the common source line $GS_2$ is connected to the common data lines $CD_2$, $\overline{CD_2}$ via the switch Q3 to be turned on by the column decode line $YS_2$, and via the switches Q1 and Q2, the potential at the common source line $GS_2$ is the same as that at the common data lines $CD_2$, $\overline{CD_2}$. Therefore, a through current does not flow, in contrast to the prior art read circuit mentioned above.

When the common data lines $CD_2$, $\overline{CD_2}$ are set in the selected state, information from the bit lines are transferred to the common data lines $CD_2$, $\overline{CD_2}$ connected to the input terminal of a main amplifier circuit ($MA_2$) 2 for detecting and amplifying the information. The precharge circuit 3 connected to the common data lines $CD_2$, $\overline{CD_2}$ enters the off state only in the active period during the time when the memory array is selected.

In this Example, the precharge potentials of the common data lines $CD_1$, $\overline{CD_1}$, $CD_2$, $\overline{CD_2}$ and of the common source lines $NS_1$, $PS_1$, $NS_2$ and $PS_2$ are set to be $V_{cc}/2$. However, any precharge level can be used as long as the common data lines have about the same precharge potential as the common source lines.

Further, the precharge level is generated by resistance division as shown in FIG. 5. However, other techniques such as a resistance drop circuit disclosed in T. Furuyama et al., 1986 ISSCC DIGEST OF TECHNICAL PAPERS pp. 272-273 may be used.

The switches Q1 and Q2 used in this Example are MOSFETs. However, any switches which can control the on resistance according to the potential of the bit lines can be used. For example, a read circuit shown in FIG. 7 has switches Q1' and Q2' of bipolar transistors.

Example 2

Figure 8:
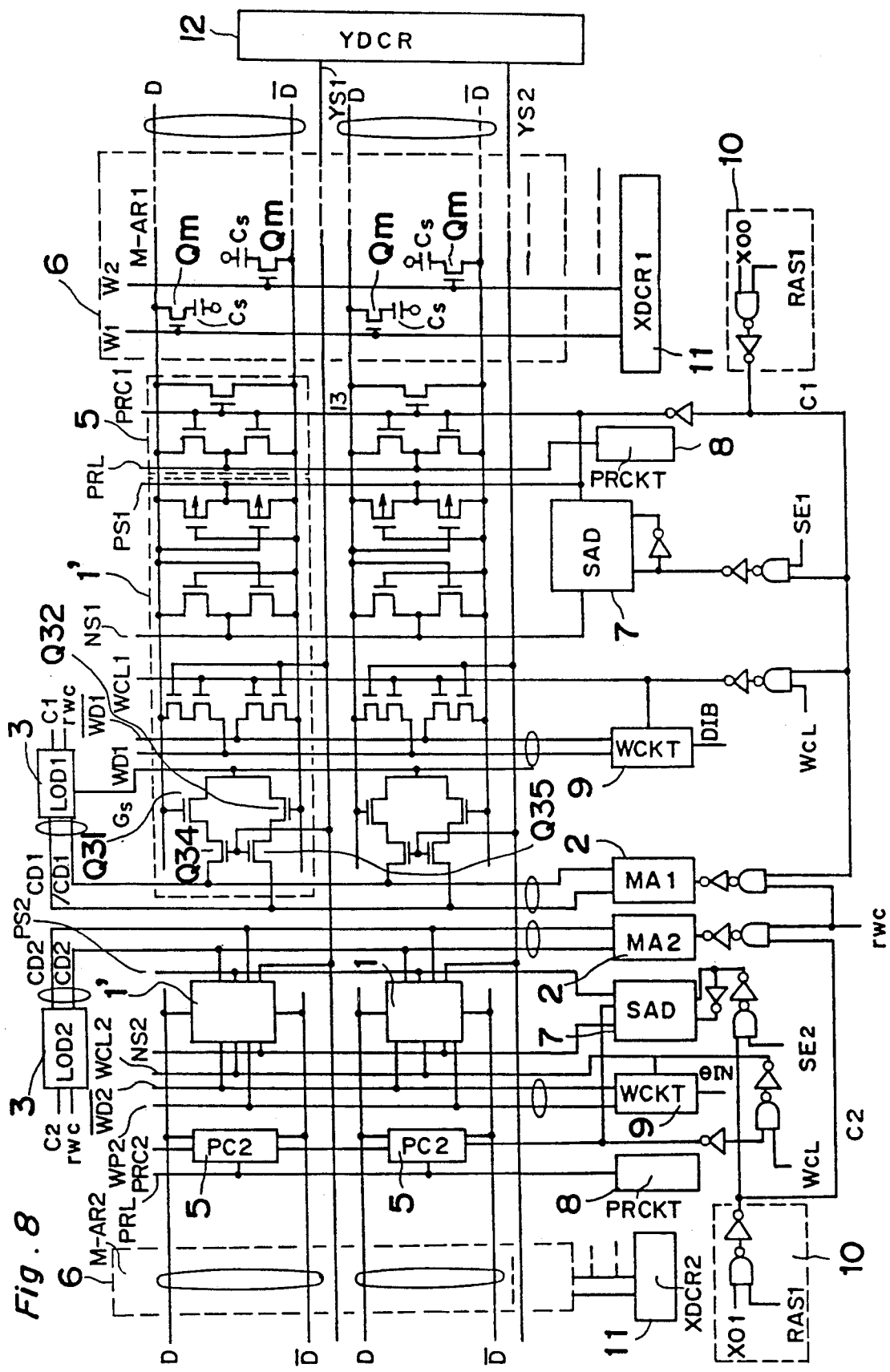
FIG. 8 is a diagram of read circuit of DRAM of Example 2.

FIG. 8 shows a diagram of a read circuit of Example 2 of DRAM wherein two memory arrays are arranged. This circuit is similar to that shown in FIG. 3, and only the differences from FIG. 3 will be explained below.

Two transistors Q34 and Q35 are added in a sense amplifier 1' instead of the transistor Q3 in FIG. 3. The drain electrodes of MOSFETs Q31 and Q32 are connected directly to the ground line $GS_n$ of the precharger 3, while the source electrodes of the MOSFETs Q31 and Q32 are connected in series to the drains of a pair of the switches Q34 and Q35. The gates of the switches Q34 and Q35 are connected to the column decode line ($YS_n$), while the source lines thereof are connected to the common data lines $CD_n$ and $\overline{CD_n}$. The switches Q34 and Q35 are switches used to control the connection of the common data lines $CD_n$, $\overline{CD_n}$ and the common source line $GS_n$ according to the on resistance of the MOSFETs Q31 and Q32.

The read action of the read circuit is explained next, and the timing chart of the read circuit is not shown because it is fundamentally similar to that shown in FIG. 6. The common source line $GS_n$ is connected to the common data lines $CD_n$, $\overline{CD_n}$ via the switches Q31, Q34 and the switches Q32, Q35. In a selected memory array, say $M-AR_1$, the memory array is changed from the standby state to the active state. The potential of the common source line $GS_1$ decreases via the switch Q50 from the half precharge level to the $V_{SS}$ level. Therefore, the potentials of the common data lines $CD_1$, $\overline{CD_1}$ also decrease under the control of the on resistances of the switches Q31, Q32.

On the other hand, in a memory array, say $M-AR_2$, not selected, the potential of the common source line $GS_2$ is kept to be the same as the precharge level, for example the half precharge level. Therefore, even if the common source line $GS_2$ is connected to the common data lines $CD_2$, $\overline{CD_2}$ via the switches Q31, Q34; Q32, Q35, the potentials are kept the same. Thus, a through current does not flow from the common data lines to the ground line of the precharger 3.

In the Example, the precharge potentials of the common data lines $CD_1$, $\overline{CD_1}$, $CD_2$, $\overline{CD_2}$ and of the common source lines $NS_1$, $PS_1$, $NS_2$ and $PS_2$ are set to be $V_{CC}/2$. However, any precharge level can be used as long as the common data lines have about the same precharge potential as the common source lines.

Further, the precharge level is generated by resistance division as shown in FIG. 5. However, other techniques such as a resistance drop circuit disclosed in T. Furuyama et al., 1986 ISSCC DIGEST OF TECHNICAL PAPERS pp. 272-273 may be used.

Figure 7:
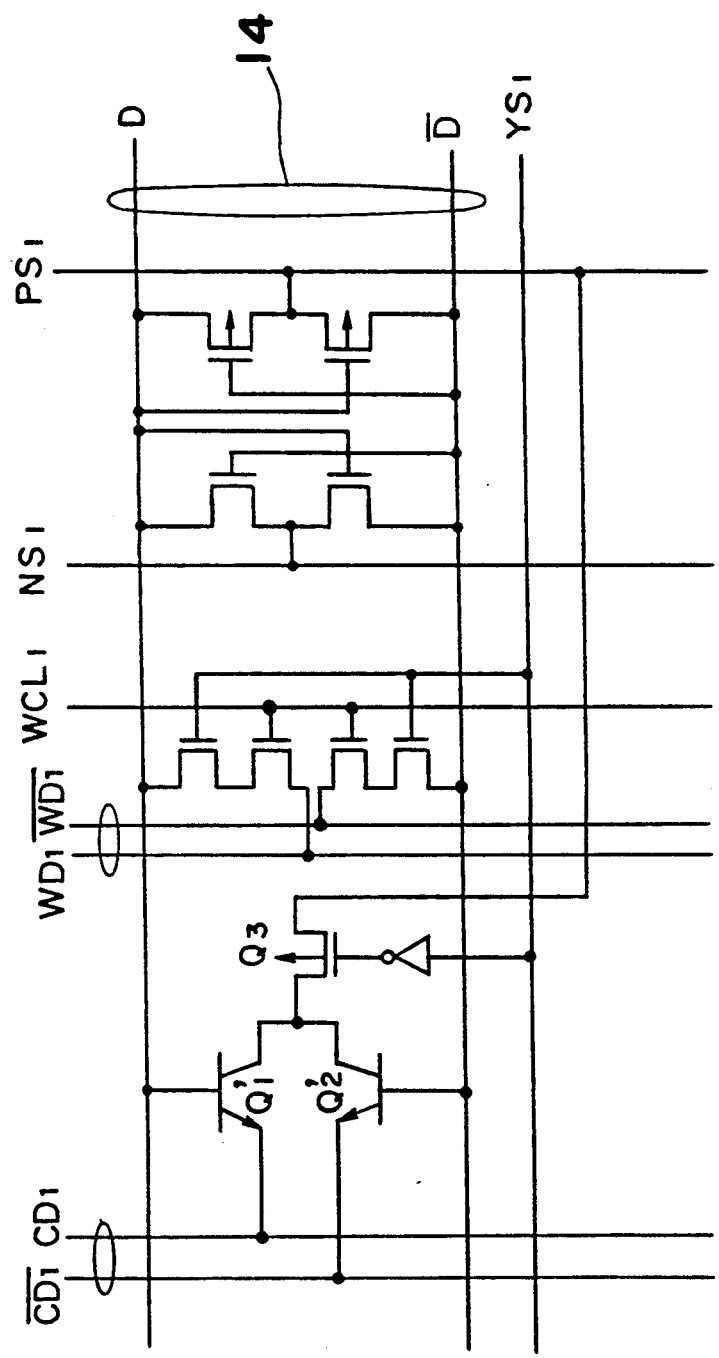
FIG. 7 is a diagram of a modified read circuit of FIG. 4.

The switches Q31 and Q32 are made from MOSFETs. However, any switches which can control the on resistance according to the potential of the bit lines can be used. For example, switches Q1' and Q2' of bipolar transistors may be used as shown in FIG. 7.

Example 3

Figure 9:
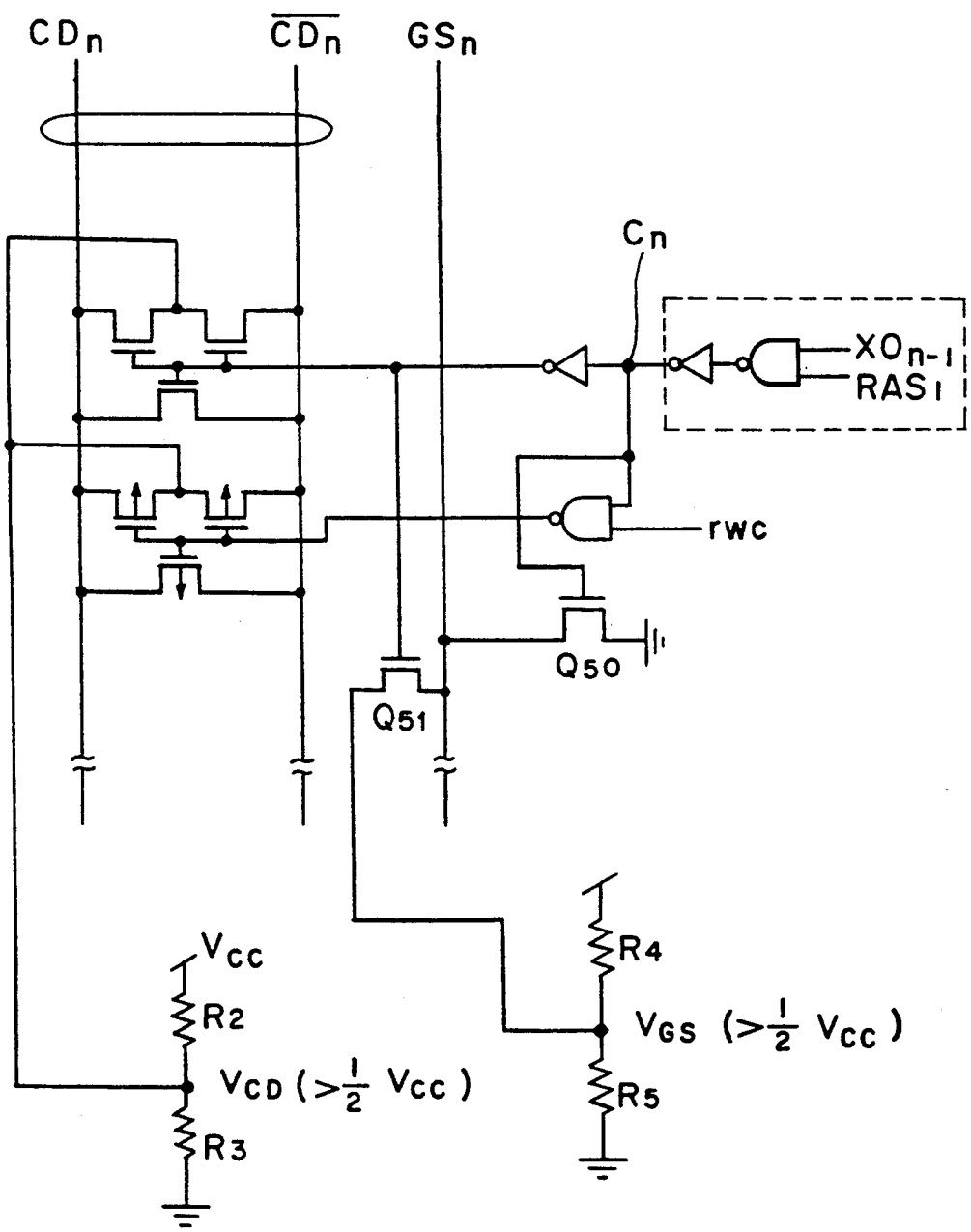
FIG. 9 is a diagram of a precharger of the read circuit of Example 3.

FIG. 9 shows a diagram of a precharger circuit 3 of Example 3 to be used in a read circuit as shown in FIG. 4. This circuit is fundamentally the same as that shown in FIG. 5 in Example 1, and only the differences are explained below.

As shown in FIG. 9, the precharge potential $V_{CD}$ for the common data lines $CD_n$, $\overline{CD_n}$ and the precharge potential $V_{GS}$ for the common source line $GS_n$ are provided separately. The precharge potential $V_{GS}$ is not required to be equal to the precharge potential $V_{CD}$. However, both precharge potentials are set to be larger than the precharge level $V_{CC}/2$ of the bit lines D, $\overline{D}$. The two precharge levels are set so that the transistors Q1, Q2 are not turned on.

Figure 10:
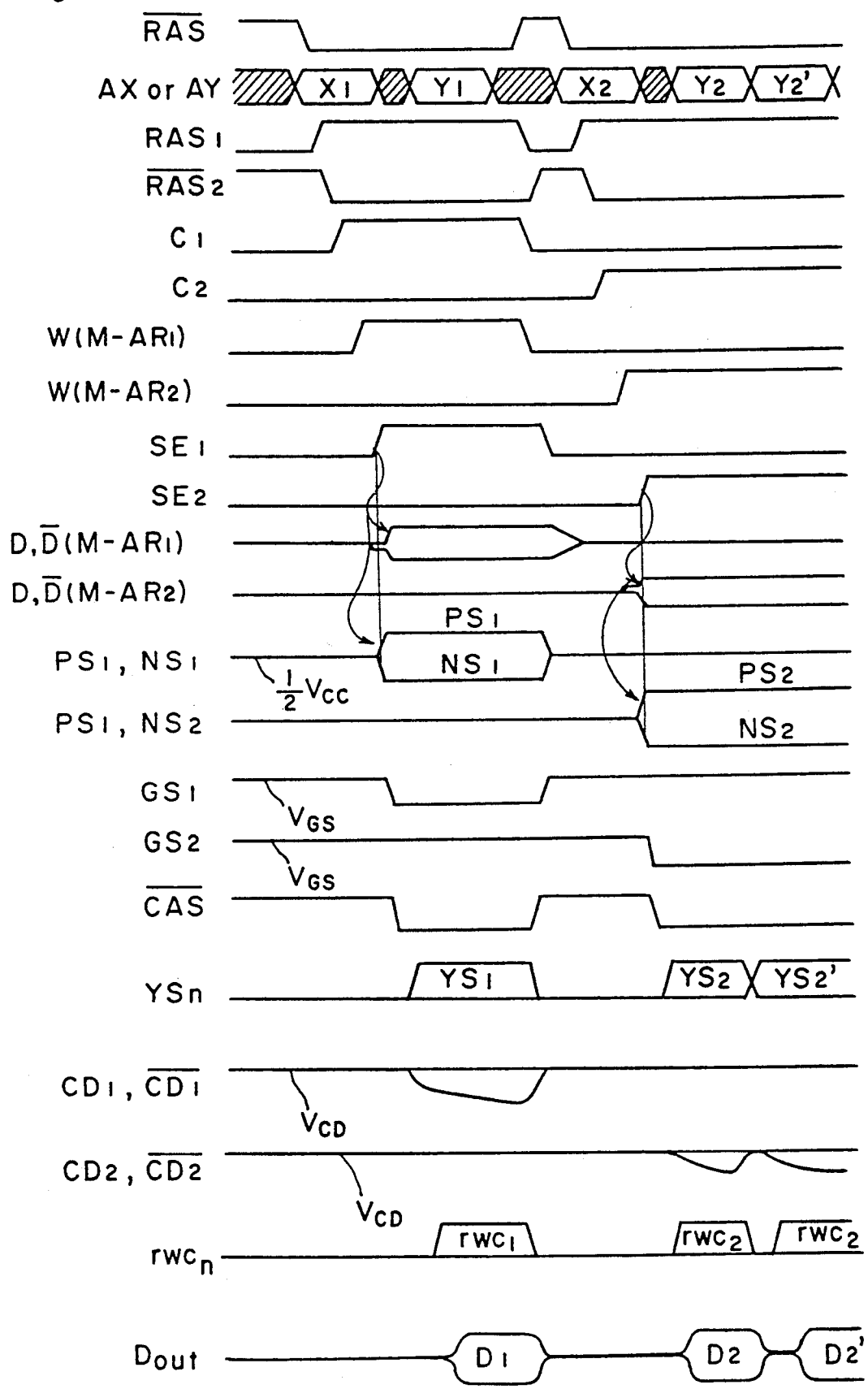
FIG. 10 is a timing chart of the read circuit of Example 3.

The read action of the read circuit using the precharger circuit of FIG. 9 is explained next, and the timing chart of the read circuit is shown in FIG. 10. The common source line $GS_n$ is connected to the common data lines $CD_n$, $\overline{CD_n}$ via the switches Q1, Q2 of the sense amplifier 1 (see FIG. 4). In a selected block, say $M-AR_1$, the block is changed from the standby state to the active state according to RAS signal. The potential of the common source line $GS_1$ decreases via the switch Q50 shown in FIG. 9 from the precharge level $V_{GS}$ to the $V_{SS}$ level. Therefore, the potentials of the common data lines $CD_1$, $\overline{CD_1}$ also decrease according to the on resistances of the switches Q1, Q2 controlled by the potential of the bit lines D, $\overline{D}$.

On the other hand, in a memory array, say $M-AR_2$, not selected, the potentials of the bit lines D, $\overline{D}$ are kept at $V_{CC}/2$, that of the common source line $GS_2$ is kept at $V_{GS}$, and those of the common data lines $CD_2$, $\overline{CD_2}$ are kept at $V_{CD}$. Therefore, even if the switch Q3 of the sense amplifier 1 is turned on by the column decode line $YS_2$, the switches Q1 and Q2 connected to the bit lines D, $\overline{D}$ at the gates are not turned on. Thus, a through current does not flow from the common data lines to the ground line of the precharger 3 even if the potential of the common data lines $CD_2$ and $\overline{CD_2}$ is different from that of the common source line $GS_2$.

In this Example, the precharge potentials $V_{CD}$ and $V_{GS}$ of the common data lines $CD_n$, $\overline{CD_n}$ and of the common source lines $GS_n$ are generated by resistance division with use of resistors $R_2$, $R_3$, $R_4$ and $R_5$. However, other techniques may also be used.

Example 4

Figure 11:
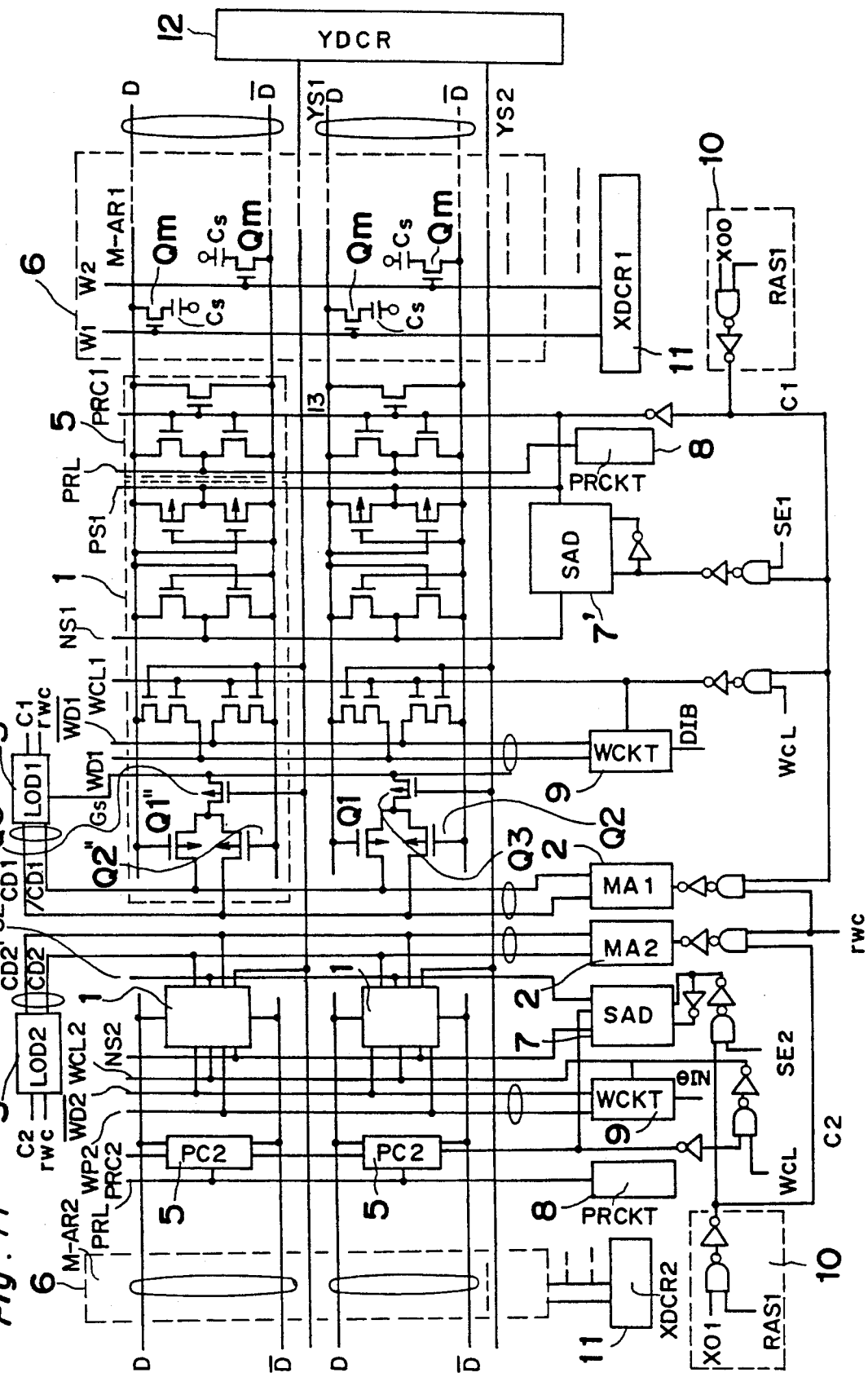
FIG. 11 is a diagram of a part of the read circuit of DRAM of Example 4.
Figure 12:
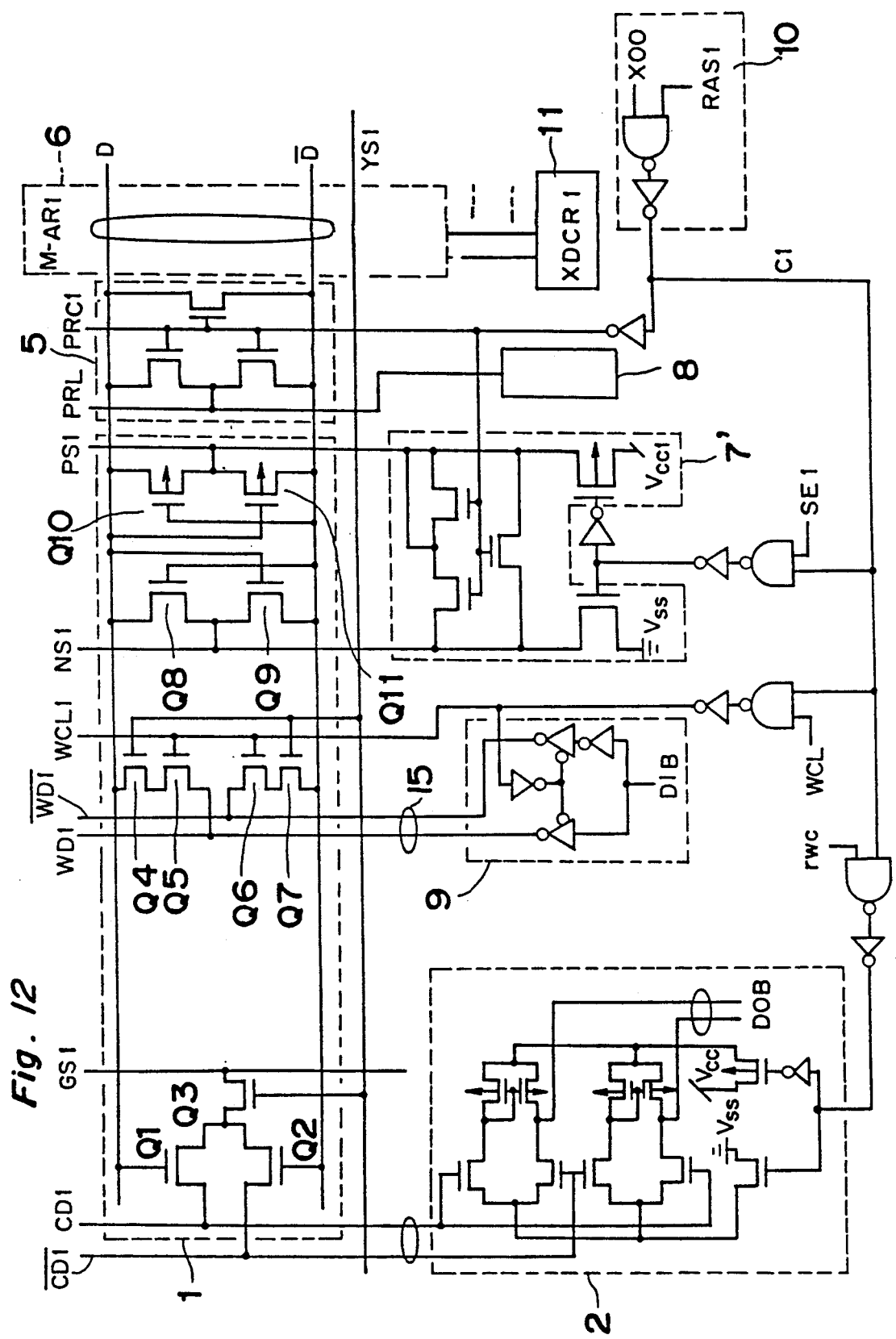
FIG. 12 is a diagram of a part of read circuit of DRAM of Example 4.
Figure 13:
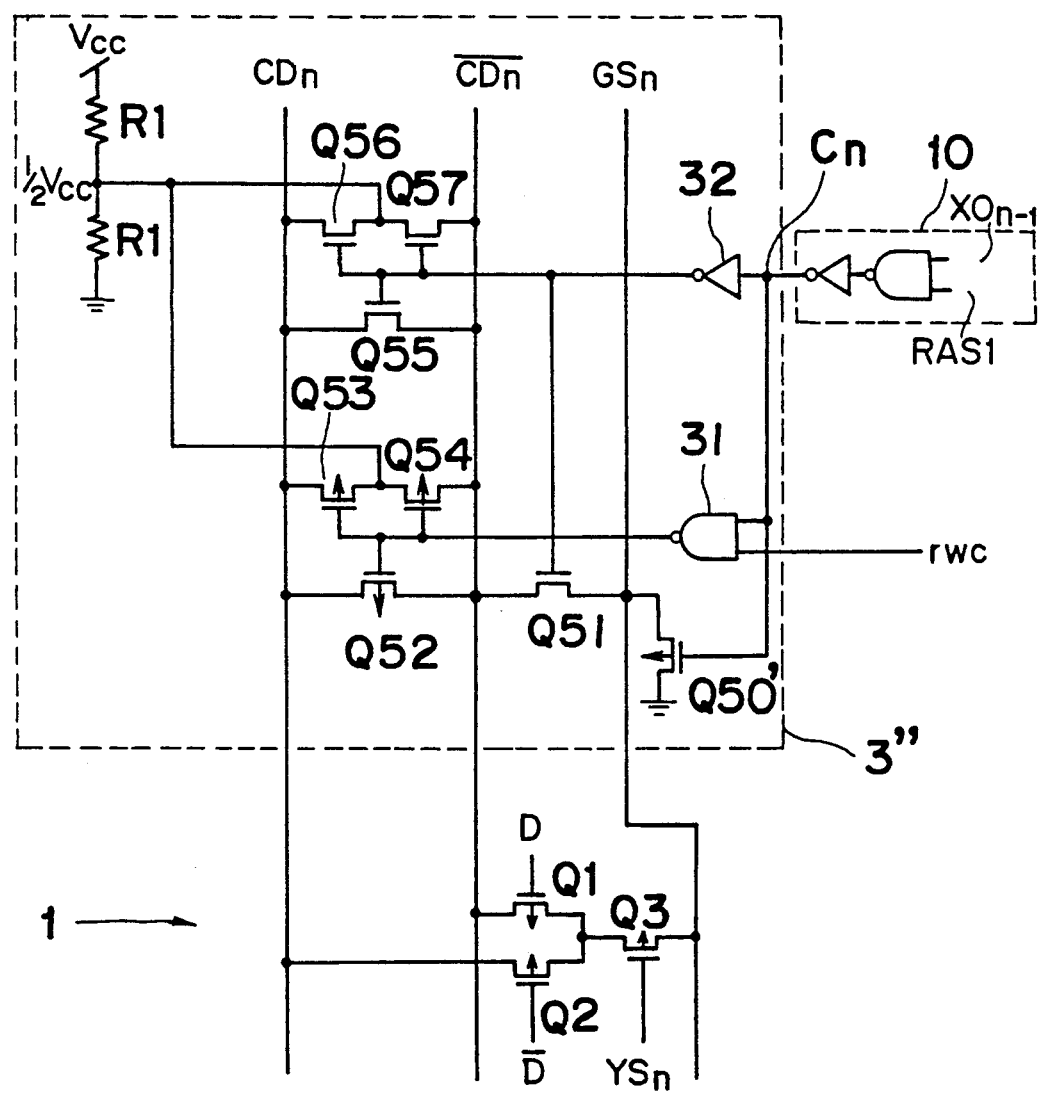
FIG. 13 is a diagram of a precharger of the read circuit of Example 4.

FIG. 11 shows a diagram of a read circuit of DRAM wherein two memory arrays are arranged and FIG. 12 shows a part of the diagram in detail, while FIG. 13 shows a diagram of precharger 3''. This circuit is similar to that shown in FIG. 3, and only the differences from FIG. 3 will be explained below.

In this Example, switches Q1'', Q2'' and Q3'' which correspond to the switches Q1, Q2 and Q3 of PMOSFETs in Example 1 are NMOSFETs. The common source line $GS_n$ is connected to the power supply potential $V_{CC}$ via a switch Q50' of PMOSFET, in contrast to the switch Q50 in Example 1 of NMOSFET connected to the ground level $V_{SS}$. Further, the common source line $PS_n$ of the PMOSFETs of sense amplifier 7' is connected to a power supply potential $V_{CC1}$ which is lower than $V_{CC}$ (FIG. 12), in contrast to the connection to $V_{CC}$ via PMOSFETs in the sense amplifier driver 7 displayed in FIG. 4. In this Example, even if a voltage to be applied to the transistors $Q_m$ and to the capacitors $C_3$ is decreased in order to improve the reliability of the memory cells, the switches Q1, Q2 and Q3 and the main amplifiers 2 can be operated at a voltage higher than the decreased voltage. Then, the read circuit can be operated at a higher speed.

Figure 14:
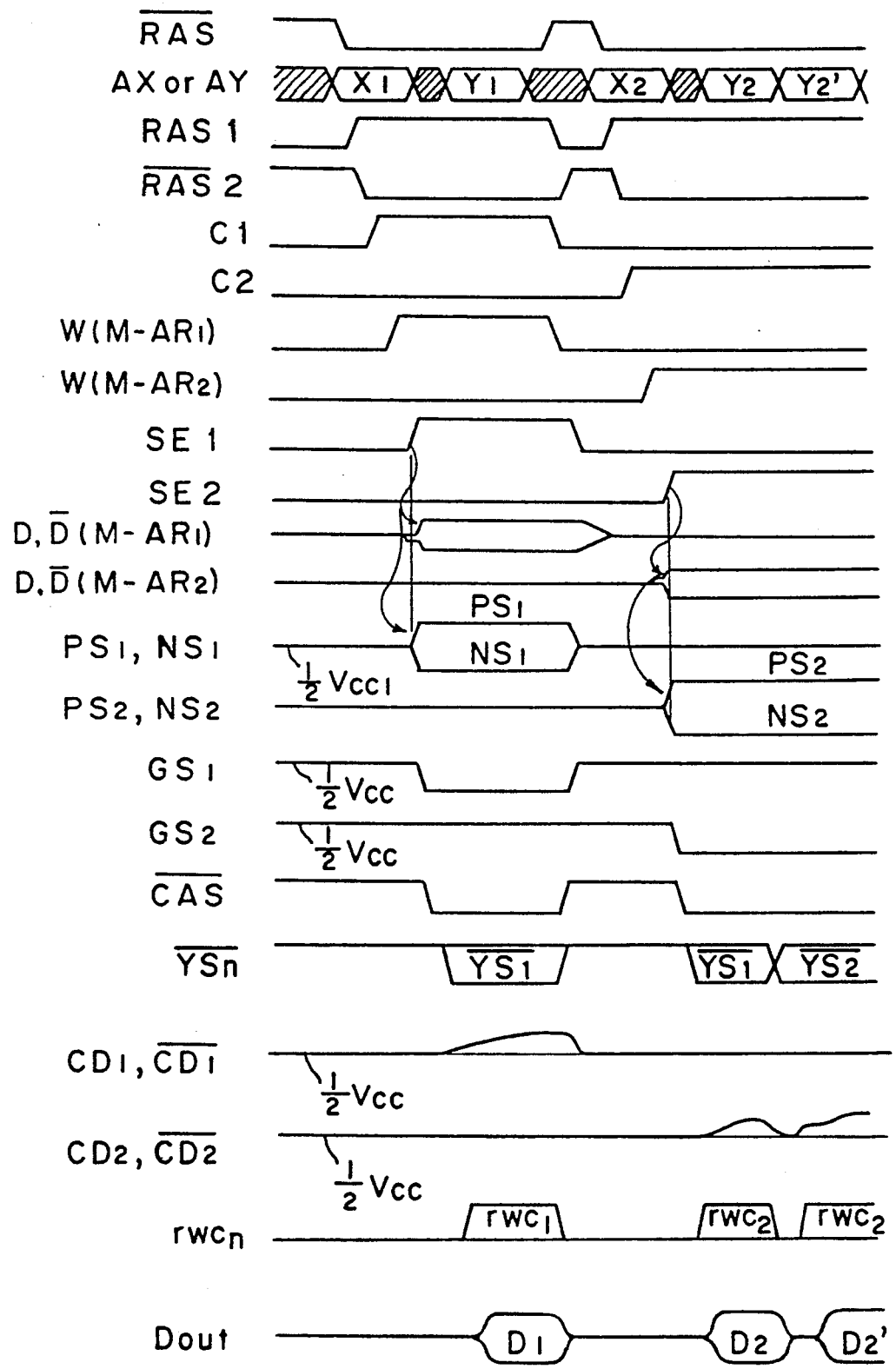
FIG. 14 is a timing chart of the read circuit of Example 4.

The read action of the read circuit is explained next, and the timing chart of the read circuit is shown in FIG. 14. The common source line $GS_n$ provided for memory arrays is connected to the common data lines $CD_n$, $\overline{CD_n}$ via the switches Q1, Q2 and Q3. In a selected block, say M-AR$_1$, the block is changed from the standby state to the active state. The potential of the common source line GS$_1$ increases via the switch Q50' shown in FIG. 13 from the precharge level of the common source line to the $V_{CC}$ level. Therefore, the potentials of the common data lines CD$_1$, $\overline{CD_1}$ (M-AR$_1$) also increase according to the on resistances of the switches Q1, Q2 controlled by the potential of the bit lines D, $\overline{D}$ (M-AR$_1$).

On the other hand, in a memory array, say M-AR$_2$, not selected, the potentials of the bit lines D, $\overline{D}$, of the common source line GS$_2$ and of the common data lines CD$_2$, $\overline{CD_2}$ are kept at the same level as the precharge level of the common source line, say $V_{CC}/2$. Therefore, even if the switch Q3 is turned on by the column decode line YS$_2$, a through current does not flow from the common data lines to the ground line of the precharger 3.

In this Example, the precharge potentials $V_{CD}$ and $V_{GS}$ of the common data lines $CD_n$, $\overline{CD_n}$ and of the common source lines $GS_n$ are generated by resistance division. However, other techniques may also be used.

Example 5

Figure 15:
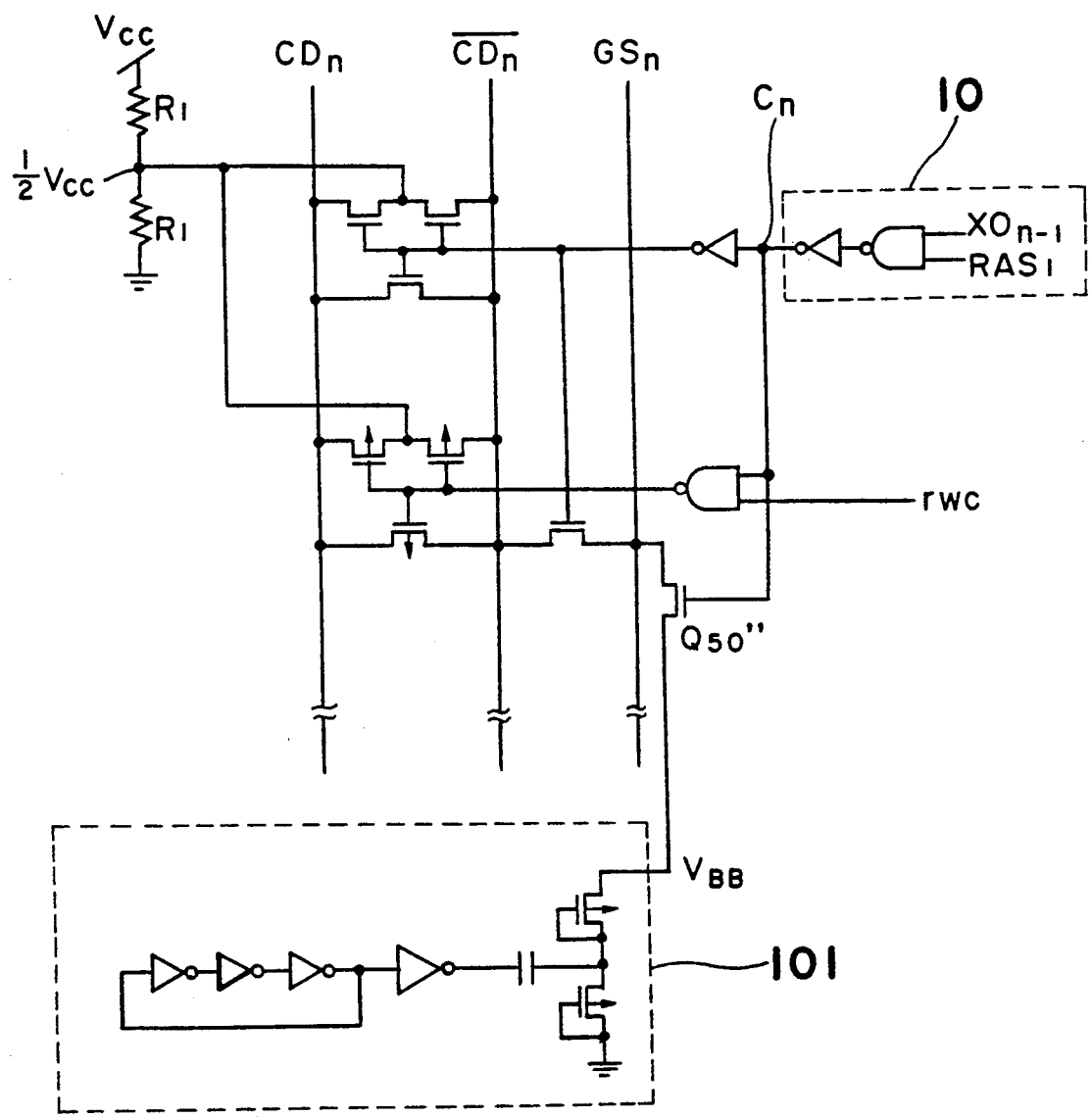
FIG. 15 is a diagram of a precharger of the read circuit of Example 5.

FIG. 15 is a diagram of a precharger circuit 3 of Example 5 to be used in a read circuit as shown in FIG. 4. This circuit is similar to that shown in FIG. 5 in Example 1, and only the differences are explained below.

As shown in FIG. 15, the common source line $GS_n$ is connected via a switch Q50'' to the output of the substrate bias voltage generator 101. The generator 101 includes an oscillator and an output circuit for providing a bias voltage $V_{BB}$ which is set higher than $V_{SS}-V_t$ (wherein $V_t$ designates the threshold voltage of the switch Q50'').

The read action of the read circuit is similar fundamentally to that of the read circuit shown in FIG. 4, and the timing chart (not shown) of the read circuit is similar to that shown in FIG. 6. The common source line $GS_n$ is connected to the common data lines $CD_n$, $\overline{CD_n}$ via the switches Q1, Q2 and Q3. In a selected block, say M-AR$_1$, the block is changed from the standby state to the active state. The potential of the common source line GS$_1$ decreases via the switch Q50'' from the half precharge level $V_{CC}/2$ to the $V_{BB}$ level. Therefore, the potentials of the common data lines CD$_1$, $\overline{CD_1}$ also decrease according to the on resistances of the switches Q1, Q2 controlled by the potential of the bit lines D, $\overline{D}$ (M-AR$_1$).

On the other hand, in a memory array, say M-AR$_1$, not selected, the potentials of the bit lines D, $\overline{D}$, of the common source line GS$_2$ are kept at the same precharge potential, say $V_{CC}/2$, as that of the common data lines CD$_2$, $\overline{CD_2}$. Therefore, even if the common source line GS$_2$ is connected to the common data lines CD$_2$, $\overline{CD_2}$ via the switches Q1, Q2 and Q3, a through current does not flow from the common data lines to the ground line of the precharger 3 because the potentials are kept the same as mentioned above.

The operation speed can be improved because the operating voltages of the switches Q1, Q2 and Q3 can be made higher.

Example 6

Figure 16:
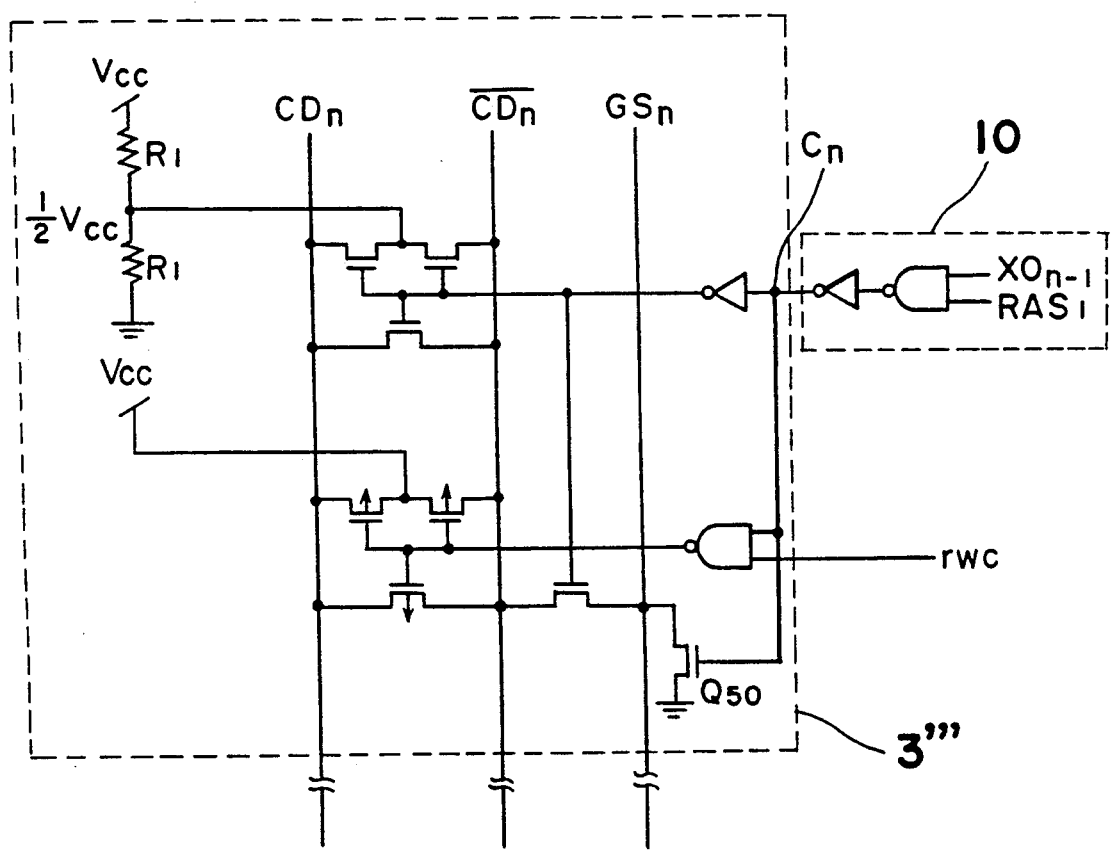
FIG. 16 is a diagram of a precharger of the read circuit of Example 6.

FIG. 16 is a diagram of a precharger circuit 3''' of Example 6. This circuit is similar to that shown in FIG. 5 in Example 1, and only the differences are explained below.

As shown in FIG. 16, the precharge potential $V_{CD}$ for the common data lines $CD_n$, $\overline{CD_n}$ when they are not selected and the precharge potential $V_{CDS}$ for the common data line $CD_n$, $\overline{CD_n}$ when they are selected are provided separately.

Figure 17:
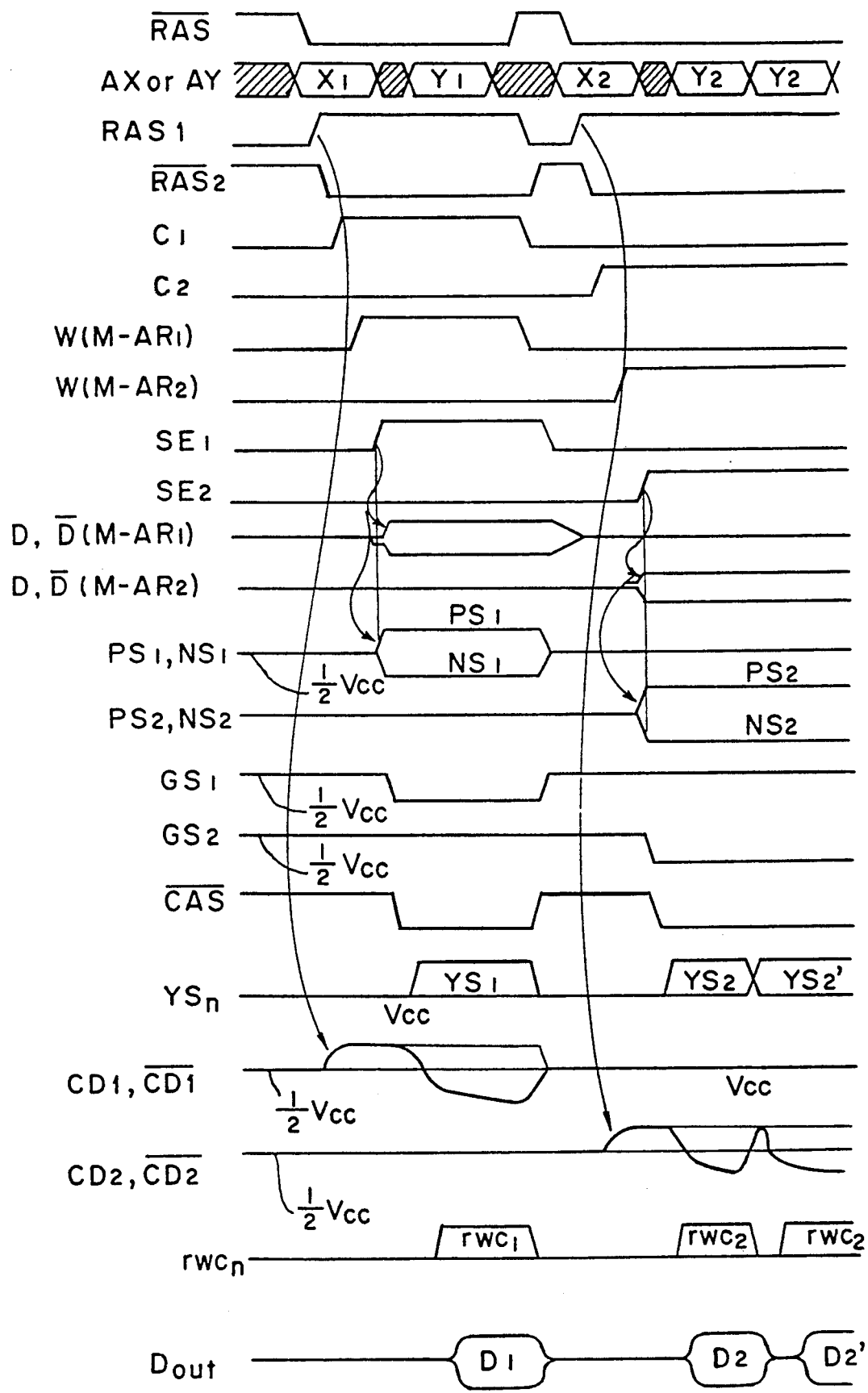
FIG. 17 is a timing chart of the read circuit of Example 6.

The read action of the read circuit is explained next, and the timing chart of the read circuit is shown in FIG. 17. In a block, say M-AR$_1$, selected according to the row address strobe signal RAS1 and the row address X0$_{n-1}$, the potentials of the common data lines CD$_1$, $\overline{CD_1}$ increase from the precharge potential $V_{CD}$, say $V_{CC}/2$ for lines not selected to the precharge potential $V_{CDS}$, say $V_{CC}$, for selected lines.

Next, the common source line GS$_1$ is connected to the common data lines CD$_1$, $\overline{CD_1}$ via the switches Q1, Q2 connected to the bit lines at the gate and via the switch Q3 to be turned on by the column decoder line YS$_1$ (see FIG. 5).

Further, the common data lines CD$_1$ and $\overline{CD_1}$ are separated from the precharge potential $V_{CDS}$ according to a signal rwc to activate the main amplifier 2. Because the potential of the common source line GS$_1$ decreases from $V_{CC}/2$ to $V_{SS}$ by the switch Q50, the potentials of the common data lines CD$_1$, $\overline{CD_1}$ also decrease according to the on resistances of the switches Q1, Q2 controlled by the potential of the bit lines D, $\overline{D}$ (M-AR$_1$).

On the other hand, in a memory array, say M-AR$_2$, not selected, the potentials of the common source line GS$_2$ and of the common data lines CD$_2$, $\overline{CD_2}$ are kept at the same precharge level, say $V_{CC}/2$. Therefore, even if the potentials of the common data lines CD$_2$ and $\overline{CD_2}$ are connected to the common source line GS$_2$ via the switches Q1, Q2 and Q3, a through current does not flow from the common data lines to the ground line of the precharger 3 because both are kept at the same potential.

In this Example, the potential of the common source line $GS_n$ attains the ground potential faster than the precharge at $V_{CC}$ when a block is selected. Further, the activation potentials for activating the switches Q1, Q2 and Q3, or the potential difference between the common data lines $CD_n$ and $\overline{CD_n}$ and the common source lines $GS_n$, is $V_{CC}$. Therefore, the reading can be operated at a faster rate.

Example 7

Figure 18:
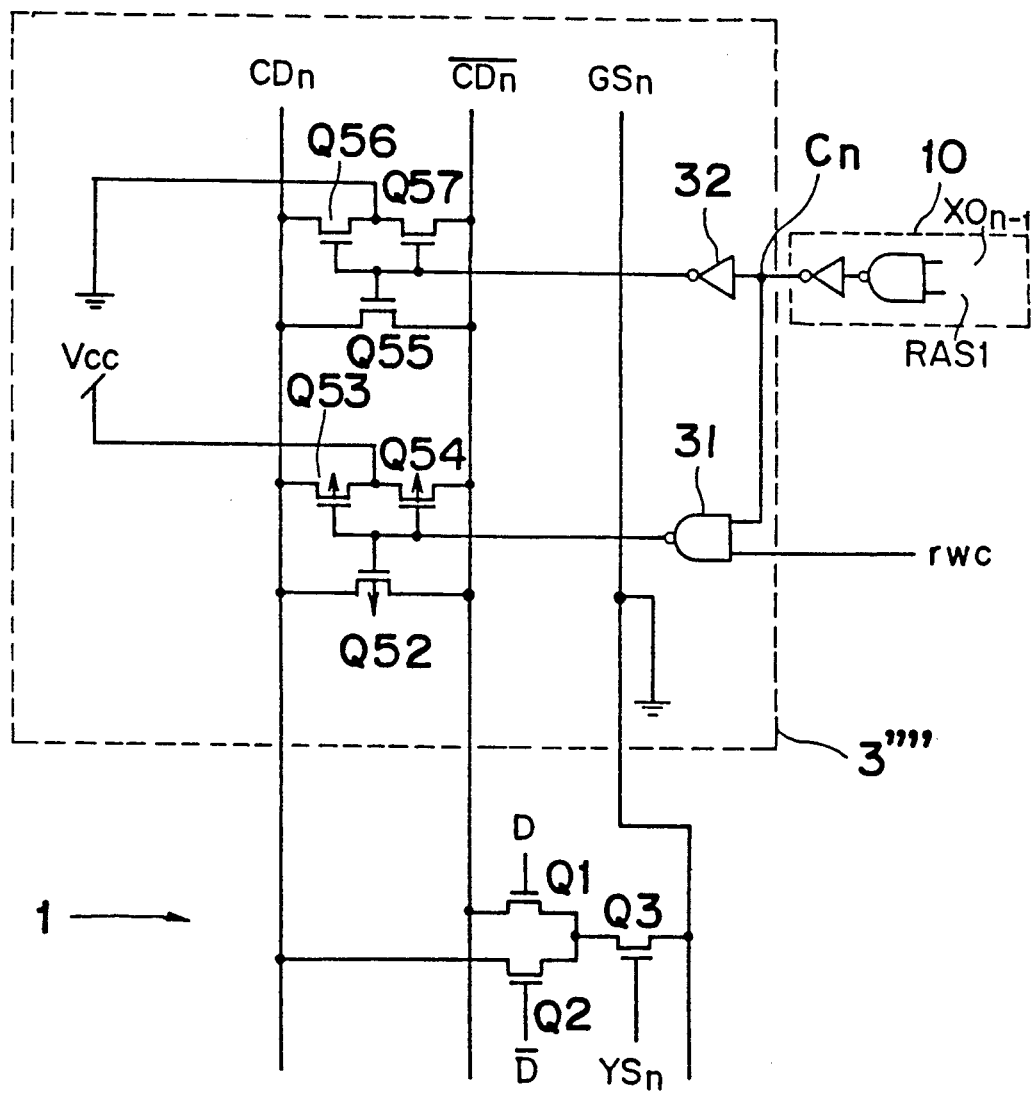
FIG. 18 is a diagram of a precharger of the read circuit of Example 7.
Figure 19:
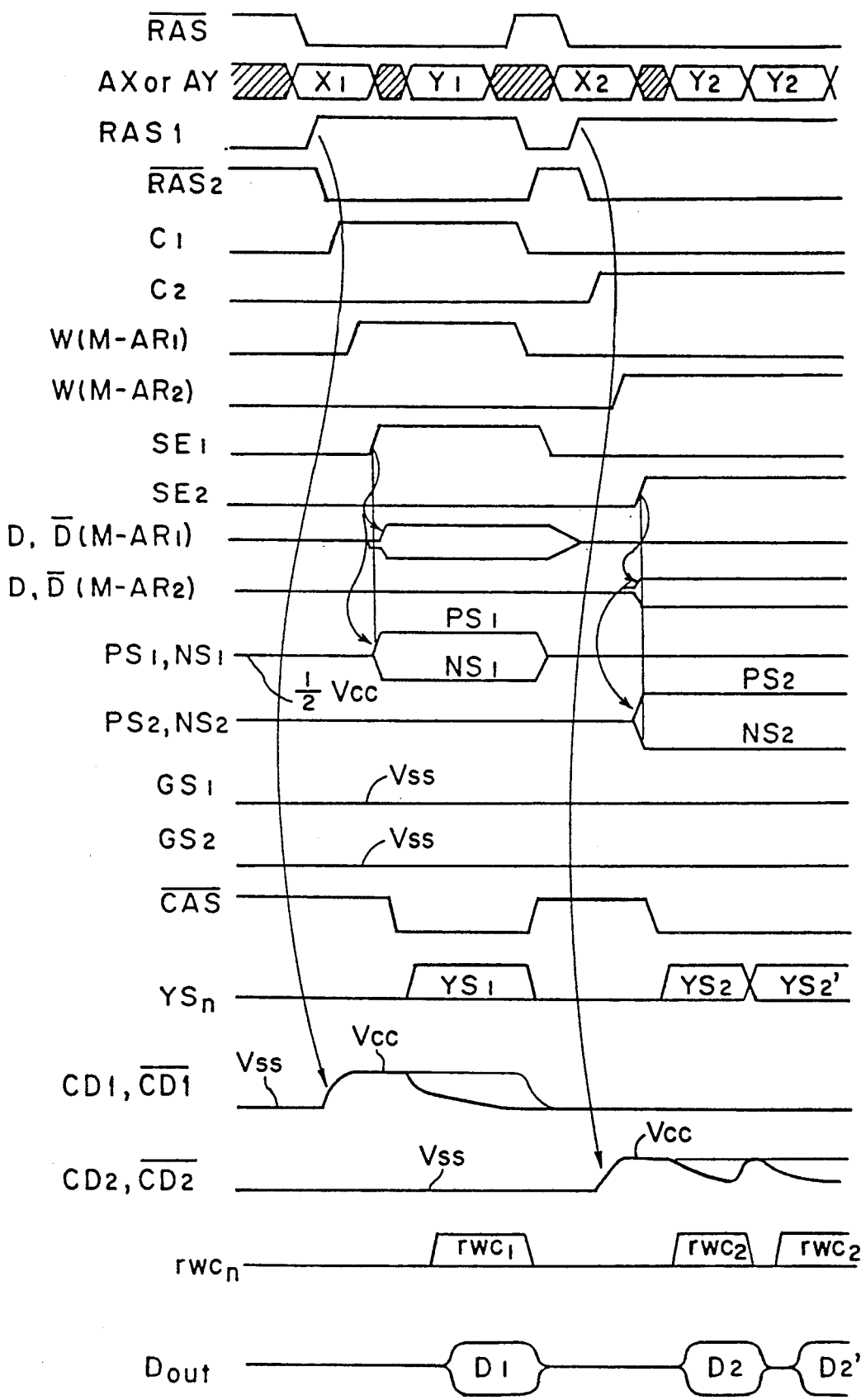
FIG. 19 is a timing chart of the read circuit of Example 7.

FIG. 18 is a diagram of a precharger circuit 3'''' of Example 7. This circuit is similar to that shown in FIG. 16 in Example 6, and only the differences are explained below.

As shown in FIG. 18, the common source line $GS_n$ is connected to the ground potential $V_{SS}$, and the precharge potential of the common data lines $CD_n$, $\overline{CD_n}$ when they are selected is the same as that of the common source line $GS_n$.

The read action of the read circuit is explained next, and the timing chart of the read circuit is shown in FIG.

19. In a block, say M-AR$_1$, selected according to the row address strobe signal RAS1 and the row address X0$_{n-1}$, the potentials of the common data lines CD$_1$, $\overline{CD_1}$ increase from the precharge potential for lines not selected to the precharge potential, say V$_{cc}$, for selected lines.

Next, the common source line GS$_1$ is connected to the common data lines CD$_1$, $\overline{CD_1}$ via the switches Q1, Q2 connected to the bit lines at the gate and via the switch Q3 to be turned on by the column decoder line YS$_1$.

Further, the common data lines CD$_1$ and $\overline{CD_1}$ are separated from the precharge potential not selected according to a signal rwc to activate the main amplifier 2. Because the potential of the common source line GS$_1$ is connected to the ground potential V$_{ss}$, the potentials of the common data lines CD$_1$, $\overline{CD_1}$ also decrease according to the on resistances of the switches Q1, Q2 controlled by the potential of the bit lines D, $\overline{D}$ (M-AR$_1$).

On the other hand, in a memory array, say M-AR$_2$, not selected, the potentials of the common data lines CD$_2$, $\overline{CD_2}$ are kept at the same potential V$_{ss}$ of the common source line GS$_2$. Therefore, even if the common data lines CD$_2$ and $\overline{CD_2}$ are connected to the common source line GS$_2$ via the switches Q1, Q2 and Q3, a through current does not flow from the common data lines to the ground line of the precharger 3 because both are kept at the same potential.

In this Example, a circuit for precharging the common source line and a circuit for providing a precharge potential when not selected are not needed. Therefore, the integration of a higher number of memory cells can be obtained.

Although the present invention has been fully described in connection with the preferred embodiments thereof with reference to the accompanying drawings, it is to be noted that various changes and modifications are apparent to those skilled in the art. Many changes explained above can be combined. For example, a precharger circuit of Example 2 can be combined to other changes in Examples 3-7. Such changes and modifications are to be understood as included within the scope of the present invention as defined by the appended claims unless they depart therefrom.

What is claimed is:

1. A read circuit for a dynamic random access memory wherein a plurality of memory cells each comprising a transistor for address selection and a capacitor for storing information are arranged as a matrix at crossings of bit lines and word lines, said memory cells being divided into a plurality of memory arrays, with a column address decoder for generating a signal for selecting a common bit line for the memory arrays, and a word line selection circuit for generating a signal to select a word line in correspondence to one of the memory arrays which includes one of the memory cells to be selected, said read circuit comprising:

a first precharger for precharging the bit lines at a first precharge potential;

a sense amplifier for amplifying the potential of the bit lines;

means for supplying a first activation potential necessary to activate the amplification of the sense amplifier;

a first switch controlled by a selection signal generated by the address decoder, the first switch being connected to a common source line, said common source line supplying a second activation potential necessary to activate the first switch;

a pair of second switches connected in series to the first switch, said pair of second switches being connected to common data lines, the on resistances of the pair of second switches being controlled according to the potential of the bit lines, said common data lines being connected so as to be always isolated electrically from the bit lines;

a second precharger for precharging the common source lines of memory arrays to a second precharge potential, and for precharging the common data lines of memory arrays to a third precharge potential during the time when the common source line and the common data lines are not selected; and a third switch for connecting the common source line to the second activation potential in the selected memory array.

2. A read circuit according to claim 1, wherein the second precharge potential is about the same level as the third precharge potential.

3. A read circuit according to claim 2, wherein the second and the third precharge potentials are set to about half of a power supply potential.

4. A read circuit according to claim 1, wherein the second precharge potential is different from the third precharge potential and both potentials are set so as to turn off the second switches.

5. A read circuit according to claim 4, wherein the second and the third precharge potentials are higher than the first precharge potential.

6. A read circuit according to claim 1, wherein the first activation potential is about equal to the second activation potential.

7. A read circuit according to claim 1, wherein the first activation potential is a first power supply potential, and the second activation potential is a second power supply potential, said second power supply potential being higher than the first power supply potential.

8. A read circuit according to claim 1, wherein the second activation potential is a second power supply potential, said second power supply potential being lower than the ground potential.

9. A read circuit according to claim 8, wherein the second power supply potential is supplied by a bias voltage generator.

10. A read circuit according to claim 1, wherein the pair of the second switches are MOSFETs.

11. A read circuit according to claim 10, wherein the pair of the second switches are NMOSFETs.

12. A read circuit according to claim 10, wherein the pair of the second switches are PMOSFETs.

13. A read circuit according to claim 1, wherein the pair of the second switches are bipolar transistors.

14. A read circuit according to claim 1, wherein the second precharger precharges the common data lines of memory arrays to a fourth precharge potential during the time when the common source line and the common data lines are selected.

15. A read circuit according to claim 14, wherein the fourth precharge potential is a power supply potential and the second and third precharge potentials are about half of the power supply potential.

16. A read circuit for a dynamic random access memory wherein a plurality of memory cells each comprising a transistor for address selection and a capacitor for storing information are arranged as a matrix at crossings of bit lines and word lines, said memory cells being divided into a plurality of memory arrays, with a column address decoder for generating a signal for selecting a common bit line for the memory arrays, and a word line selection circuit for generating a signal to select a word line in correspondence to one of the memory arrays which includes one of the memory cells to be selected, said read circuit comprising:

- a first precharger for precharging the bit lines at a first precharge potential;
- a sense amplifier for amplifying the potential of the bit lines;
- means for supplying a first activation potential necessary to activate the amplification of the sense amplifier;
- a pair of first switches controlled by a selection signal generated by the address decoder, the first switches being connected to common data lines;
- a pair of second switches each connected in series to one of the first switches, said pair of second switches being connected to a common source line, said common source line supplying a second activation potential necessary to activate the second switches, the on resistances of the pair of second switches being controlled according to the potential of the bit lines, said common data lines being connected so as to be always isolated electrically from the bit lines;
- a second precharger for precharging the common source lines of memory arrays to a second precharge potential, and for precharging the common data lines of memory arrays to a third precharge potential during the time when the common source line and the common data lines are not selected; and
- a third switch for connecting the common source line to the second activation potential in the selected memory array.

17. A read circuit according to claim 16, wherein the second precharge potential is about the same level as the third precharge potential.

18. A read circuit according to claim 17, wherein the second and the third precharge potentials are set to about half of a power supply potential.

19. A read circuit according to claim 16, wherein the second precharge potential is different from the third precharge potential and both potentials are set so as to turn off the second switches.

20. A read circuit according to claim 19, wherein the second and the third precharge potentials are higher than the first precharge potential.

21. A read circuit according to claim 16, wherein the first activation potential is about equal to the second activation potential.

22. A read circuit according to claim 16, wherein the first activation potential is a first power supply potential, the second activation potential is a second power supply potential, said second power supply potential being higher than the first power supply potential.

23. A read circuit according to claim 16, wherein the second activation potential is a second power supply potential, said second power supply potential being lower than the ground potential.

24. A read circuit according to claim 23, wherein the second power supply potential is supplied by a bias voltage generator.

25. A read circuit according to claim 16, wherein the pair of the second switches are MOSFETs.

26. A read circuit according to claim 25, wherein the pair of the second switches are NMOSFETs.

27. A read circuit according to claim 25, wherein the pair of the second switches are PMOSFETs.

28. A read circuit according to claim 16, wherein the pair of the second switches are bipolar transistors.

29. A read circuit according to claim 16, wherein the second precharger precharges the common data lines of memory arrays to a fourth precharge potential during the time when the common source line and the common data lines are selected.

30. A read circuit according to claim 29, wherein the fourth precharge potential is a power supply potential and the second and third precharge potentials are about half of the power supply potential.

31. A read circuit for a dynamic random access memory wherein a plurality of memory cells each comprising a transistor for address selection and a capacitor for storing information are arranged as a matrix at crossings of bit lines and word lines, said memory cells being divided into a plurality of memory arrays, with a column address decoder for generating a signal for selecting a common bit line for the memory arrays, and a word line selection circuit for generating a signal to select a word line in correspondence to one of the memory arrays which includes one of the memory cells to be selected, said read circuit comprising:

- a first precharger for precharging the bit lines at a first precharge potential;
- a sense amplifier for amplifying the potential of the bit lines;
- means for supplying a first activation potential necessary to activate the amplification of the sense amplifier;
- a first switch controlled by a selection signal generated by the address decoder, the first switch being connected to a common source line, said common source line supplying a second activation potential necessary to activate the first switch, said common source line being connected to a ground potential;
- a pair of second switches connected in series to the first switch, said pair of second switches being connected to common data lines, the on resistances of the pair of second switches being controlled according to the potential of the bit lines, said common data lines being connected so as to be always isolated electrically from the bit lines; and
- a second precharger for precharging the common data lines of memory arrays to a second precharge potential during the time when the common source line and the common data lines are not selected, and to a third precharge potential during the time when the common source line and the common data lines are selected;
- wherein the first, second and the third precharge potentials are set so as to prevent a through current through ground.

32. A read circuit according to claim 31, wherein the second precharge potential is about equal to the second activation potential and the second activation potential is the ground potential.

33. A read circuit for a dynamic random access memory wherein a plurality of memory cells each comprising a transistor for address selection and a capacitor for storing information are arranged as a matrix at crossings of bit lines and word lines, said memory cells being divided into a plurality of memory arrays, with a column address decoder for generating a signal for selecting a common bit line for the memory arrays, and a word line selection circuit for generating a signal to select a word line in correspondence to one of the memory arrays which includes one of the memory cells to be selected, said read circuit comprising:

- a first precharger for precharging the bit lines at a first precharge potential;
- a sense amplifier for amplifying the potential of the bit lines;
- means for supplying a first activation potential necessary to activate the amplification of the sense amplifier;
- a pair of first switches controlled by a selection signal generated by the address decoder, the first switches being connected to common data lines
- a pair of second switches each connected in series to one of the first switches, said pair of second switches being connected to a common source line, said common source line supplying a second activation potential necessary to activate the second switches, said common source line being connected to the ground potential, the on resistances of the pair of second switches being controlled according to the potential of the bit lines, said common data lines being connected so as to be always isolated electrically from the bit lines; and
- a second precharger for precharging the common data lines of memory arrays to a second precharge potential during the time when the common source line and the common data lines are not selected, and to a third precharge potential during the time when the common source line and the common data lines are selected;
- wherein the first, second and the third precharge potentials are set so as to prevent a through current through ground.

34. A read circuit according to claim 33, wherein the second precharge potential is about equal to the second activation potential, and the second activation potential is the ground potential.

* * * * *

UNITED STATES PATENT AND TRADEMARK OFFICE
CERTIFICATE OF CORRECTION

PATENT NO. : 5,291,450  
DATED : March 1, 1994  
INVENTOR(S) : Atsushi Fujiware et al Page 1 of 2

It is certified that error appears in the above-indentified patent and that said Letters Patent is hereby corrected as shown below:

On the title page: Item [75] "Astsuhi Fujiware" should read --Atsushi Fujiware --.

Column 1, Line 29, "hit" should read --bit--.

Column 2, Line 46, "the arrays" should read --the memory arrays--

Column 3, Line 19, "the arrays" should read --the memory arrays--

Column 4, Line 46, "$DC_n/\overline{CD}_n$" should read --$CD_n$, $\overline{CD}_n$--.

Column 4, Line 65, "$CD_n$, $CD_n$" should read --$CD_n$, $\overline{CD}_n$--.

Column 5, Line 42, "$CD_n$" should read --$\overline{CD}_n$--.

Column 7, Line 45, delete "to be".

Column 7, Line 52, "the" (first occurrence) should read --this--.

UNITED STATES PATENT AND TRADEMARK OFFICE
CERTIFICATE OF CORRECTION

PATENT NO. : 5,291,450
DATED : March 1, 1994
INVENTOR(S) : Atsushi Fujiware et al.

It is certified that error appears in the above-indentified patent and that said Letters Patent is hereby corrected as shown below:

Column 9, line 61, "$M-AR_1$" should read --$M-AR_2$, --.

Signed and Sealed this

Sixth Day of June, 1995

Attest:

BRUCE LEHMAN

*Attesting Officer*    *Commissioner of Patents and Trademarks*